(12) United States Patent
Cha et al.

(10) Patent No.: US 10,476,529 B2
(45) Date of Patent: Nov. 12, 2019

(54) ERROR DETECTION CODE GENERATION CIRCUITS OF SEMICONDUCTOR DEVICES, MEMORY CONTROLLERS INCLUDING THE SAME AND SEMICONDUCTOR MEMORY DEVICES INCLUDING THE SAME

(71) Applicant: SAMSUNG ELECTRONICS CO., LTD., Suwon-si, Gyeonggi-Do (KR)

(72) Inventors: Sang-Uhn Cha, Yongin-si (KR); Ye-Sin Ryu, Seoul (KR); Young-Sik Kim, Gunpo-si (KR); Su-Yeon Doo, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 91 days.

(21) Appl. No.: 15/789,653

(22) Filed: Oct. 20, 2017

(65) Prior Publication Data

US 2018/0159558 A1    Jun. 7, 2018

(30) Foreign Application Priority Data

Dec. 2, 2016   (KR) ........................ 10-2016-0163223

(51) Int. Cl.
   *G06F 11/10*    (2006.01)
   *H03M 13/29*    (2006.01)
   *H03M 13/09*    (2006.01)
(52) U.S. Cl.
   CPC ....... *H03M 13/2906* (2013.01); *H03M 13/09* (2013.01)

(58) Field of Classification Search
   CPC ...... H03M 13/00; H03M 13/09; H03M 13/29; H03M 13/2906; H04B 7/04; H04L 1/00; H04W 4/00; H04W 72/04
   USPC .......................................... 714/807
   See application file for complete search history.

(56) References Cited

U.S. PATENT DOCUMENTS

| 5,410,546 | A  | * | 4/1995 | Boyer .................. G06F 11/10 714/763 |
| 6,938,201 | B2 |   | 8/2005 | Goyins et al. |
| 8,099,651 | B2 |   | 1/2012 | Normoyle et al. |
| 8,207,976 | B2 |   | 6/2012 | Hein |
| 8,321,778 | B2 |   | 11/2012 | Bains |
| 8,539,305 | B2 |   | 9/2013 | Moon |
| 8,560,927 | B1 | * | 10/2013 | Pagiamtzis ............ G06F 11/10 714/704 |

(Continued)

*Primary Examiner* — Albert Decady
*Assistant Examiner* — Enamul M Kabir
(74) *Attorney, Agent, or Firm* — F. Chau & Associates, LLC

(57) ABSTRACT

An error detection code generation circuit of a semiconductor device includes a first cyclic redundancy check (CRC) engine, a second CRC engine and an output selection engine. The first CRC engine generates first error detection code bits using a first generation matrix, based on a plurality of first unit data and first DBI bits in response to a mode signal. The second CRC engine generates second error detection code bits using a second generation matrix, based on a plurality second unit data and second DBI bits, in response to the mode signal. The output selection engine generates final error detection code bits by merging the first error detection code bits and the second error detection code bits in response to the mode signal. The first generation matrix is the same as the second generation matrix.

20 Claims, 21 Drawing Sheets

(56) References Cited

U.S. PATENT DOCUMENTS

| | | | |
|---|---|---|---|
| 9,170,894 B2 | 10/2015 | Shaeffer et al. | |
| 2009/0019344 A1* | 1/2009 | Yoon | G06F 11/1004 714/807 |
| 2009/0313520 A1* | 12/2009 | Chung | H03M 13/116 714/751 |
| 2011/0107191 A1* | 5/2011 | Chung | G06F 11/1008 714/807 |
| 2011/0127990 A1* | 6/2011 | Wilson | H04L 25/49 324/76.44 |
| 2012/0079347 A1* | 3/2012 | Ziesler | H03M 13/091 714/758 |
| 2013/0061102 A1* | 3/2013 | Sohn | G11C 7/1006 714/718 |
| 2014/0019833 A1 | 1/2014 | Bae et al. | |
| 2014/0026021 A1* | 1/2014 | Hill | G06F 11/1004 714/807 |
| 2015/0019932 A1* | 1/2015 | Kondo | G06F 11/1008 714/758 |
| 2016/0062830 A1 | 3/2016 | Cha et al. | |
| 2016/0173128 A1* | 6/2016 | Ware | H03M 13/05 714/768 |
| 2016/0233979 A1* | 8/2016 | Koike-Akino | H03M 13/1111 |
| 2017/0075754 A1* | 3/2017 | Wang | G06F 11/1004 |

\* cited by examiner

FIG. 13

| BURST / PIN | 0 | 1 | 2 | 3 | 4 | 5 | 6 | 7 |
|---|---|---|---|---|---|---|---|---|
| DQ0 | d0 | d1 | d2 | d3 | d4 | d5 | d6 | d7 |
| DQ1 | d8 | d9 | d10 | d11 | d12 | d8 | d14 | d15 |
| DQ2 | d16 | d17 | d18 | d19 | d20 | d16 | d22 | d23 |
| DQ3 | d24 | d25 | d26 | d27 | d28 | d24 | d30 | d31 |
| DQ4 | d32 | d23 | d34 | d35 | d36 | d32 | d38 | d39 |
| DQ5 | d40 | d41 | d42 | d43 | d44 | d40 | d46 | d47 |
| DQ6 | d48 | d49 | d50 | d51 | d52 | d48 | d54 | d55 |
| DQ7 | d56 | d57 | d58 | d59 | d60 | d56 | d62 | d63 |
| DBIP | d64 | d65 | d66 | d67 | d68 | d64 | d70 | d71 |

ERROR DETECTION CODE GENERATION CIRCUITS OF SEMICONDUCTOR DEVICES, MEMORY CONTROLLERS INCLUDING THE SAME AND SEMICONDUCTOR MEMORY DEVICES INCLUDING THE SAME

CROSS-REFERENCE TO RELATED APPLICATION

This U.S. non-provisional patent application claims priority under 35 U.S.C. § 119 to Korean Patent Application No. 10-2016-0163223, filed on Dec. 2, 2016, in the Korean Intellectual Property Office, the disclosure of which is incorporated by reference herein in its entirety.

TECHNICAL FIELD

The present inventive concept relates to memories, and more particularly, to error detection code generation circuits of semiconductor devices, memory controllers including the same and semiconductor memory devices including the same.

DISCUSSION OF RELATED ART

Semiconductor memory devices may be classified as non-volatile memory devices that retain stored information after having been powered down and volatile memory devices that lose content when powered down. Flash memory devices are example of non-volatile memory devices and dynamic random access memories (DRAMs) are examples of volatile memory devices. DRAMS are being used for system memories due to their high speed operation and cost efficiency. However, as DRAMs shrink in size, bit errors of memory cells in the DRAMs may increase and, consequently, yield of the DRAMs may decrease.

SUMMARY

According to exemplary embodiments of the present inventive concept, an error detection code generation circuit of a semiconductor device includes a first cyclic redundancy check (CRC) engine, a second CRC engine and an output selection engine. The first CRC engine generates first error detection code bits using a first generation matrix, based on a plurality of first unit data and first data bus inversion (DBI) bits, each of the first DBI bits indicating whether a corresponding bit of the first unit data is inverted, in response to a mode signal. The mode signal indicates a code rate mode. The second CRC engine generates second error detection code bits using a second generation matrix, based on a plurality second unit data and second DBI bits, each of the second DBI bits indicating whether a corresponding bit of the second unit data is inverted, in response to the mode signal. The output selection engine generate final error detection code bits by merging the first error detection code bits and the second error detection code bits in response to the mode signal. The first generation matrix is the same as the second generation matrix.

According to exemplary embodiments of the present inventive concept, a memory controller includes an error detection code generation circuit and an error detector. The error detection code generation circuit, in response to a mode signal, generates first error detection code bits based on a plurality of first unit data and first DBI bits, each of the first DBI bits indicating whether a corresponding bit of the first unit data is inverted, generates second error detection code bits based on a plurality second unit data and second DBI bits, each of the second DBI bits indicating whether a corresponding one of the second unit data is inverted, and generates final error detection code bits by merging the first error detection code bits and the second error detection code bits. The mode signal indicates a code rate mode and the first unit data and the second unit data are included in a main data. The error detector detects errors of the main data which is to be transmitted to a semiconductor memory device, based on return final error detection code bits and the final error detection code bits. The semiconductor memory device receives the main data, the first DBI bits and the second DBI bits and generates the return final error detection code bits. The error detection code generation circuit generates the first error detection code bits and the second error detection code bits by using a same generation matrix.

According to exemplary embodiments of the present inventive concept, a semiconductor memory device includes a memory cell array, an error detection code generation circuit, an error detector and a control logic circuit. The error detection code generation circuit, in response to a mode signal, generates first error detection code bits and second error detection code bits based on main data including a plurality of first unit data and a plurality second unit data, first DBI bits, each of the first DBI bits indicating whether a corresponding bit of the first unit data is inverted, and second DBI bits, each of the second DBI bit indicating whether a corresponding bit of the second unit data is inverted, and generates final error detection code bits by merging the first error detection code bits and the second error detection code bits. The mode signal indicates a code rate mode and the first unit data and the second unit data are transmitted from a memory controller and are to be stored in the memory cell array. The error detector generates a detection signal which indicates whether the main data, which is transmitted from the memory controller, includes errors based on the final error detection code bits and transmission error detection code bits. The memory controller generates the transmission error detection code bits based on the main data, the first DBI bits and the second DBI bits. The control logic circuit controls an access to the memory cell array in response to a command and an address provided from the memory controller.

According to exemplary embodiments of the present inventive concept, an error detection code generation circuit of a semiconductor device may include: a first CRC engine configured to generate first error detection code bits using a first matrix, in response to a plurality of first unit data and first DBI bits, wherein each of the first DBI bits indicates whether a corresponding bit of the first unit data is inverted, in response to a mode signal; a second CRC engine configured to generate second error detection code bits using a second matrix, in response a plurality second unit data and second DBI bits, wherein each of the second DBI bits indicates whether a corresponding bit of the second unit data is inverted, in response to the mode signal; and an output selection engine configured to generate final error detection code bits by merging the first error detection code bits and the second error detection code bits in response to the mode signal

BRIEF DESCRIPTION OF THE DRAWINGS

The above and other features of the present inventive concept will become more clearly understood by describing in detail exemplary embodiments thereof with reference to the accompanying drawings.

FIG. 13 illustrates main data and DBI bits when a semiconductor memory device in FIG. 2 operates in an X8 mode according to exemplary embodiments of the present inventive concept.

DETAILED DESCRIPTION OF THE EMBODIMENTS

Exemplary embodiments of the present inventive concept will be described more fully hereinafter with reference to the accompanying drawings.

Figure 1:
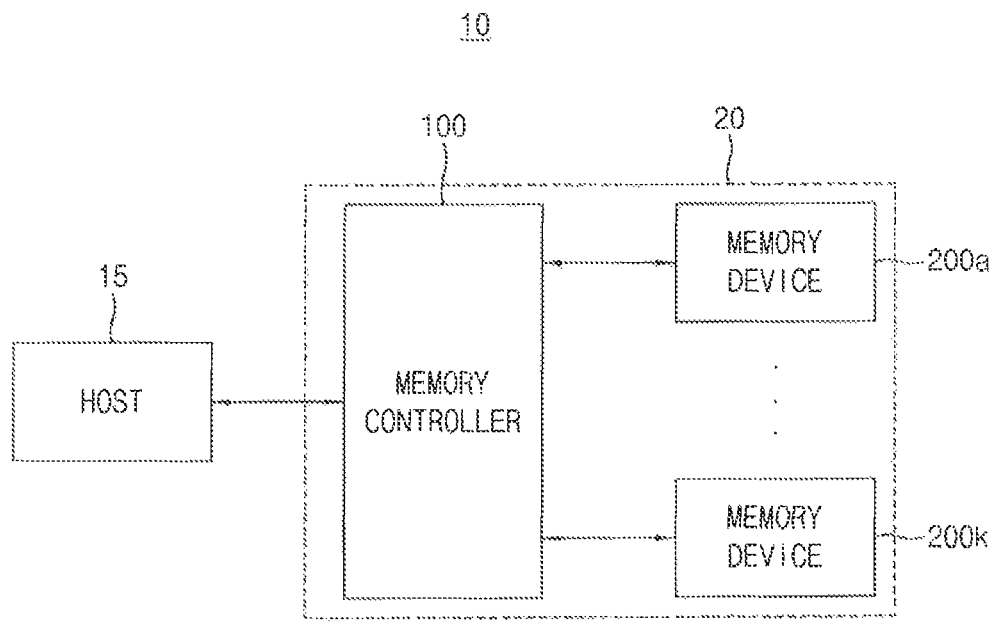
FIG. 1 is a block diagram illustrating an electronic system according to exemplary embodiments of the present inventive concept.

FIG. 1 is a block diagram illustrating an electronic system according to exemplary embodiments of the present inventive concept.

Referring to FIG. 1, an electronic system (or an electronic device) 10 includes a host 15 (e.g., a host device, a host computer, etc.) and a memory system 20. The memory system 20 includes a memory controller 100 and a plurality of semiconductor memory devices 200a~200k (k is an integer greater than two).

The host 15 may communicate with the memory system 20 through various interface protocols such as Peripheral Component Interconnect-Express (PCI-E), Advanced Technology Attachment (ATA), Serial ATA (SATA), Parallel ATA (PATA), or serial attached small computer system interface (SAS). In addition, the host 15 may also communicate with the memory system 20 through interface protocols such as Universal Serial Bus (USB), Multi-Media Card (MMC), Enhanced Small Disk Interface (ESDI), or Integrated Drive Electronics (IDE).

The memory controller 100 may control an overall operation of the memory system 20. The memory controller 100 may control an overall data exchange between the host 15 and the plurality of semiconductor memory devices 200a~200k. For example, the memory controller 100 may write data in the plurality of semiconductor memory devices 200a~200k or read data from the plurality of semiconductor memory devices 200a~200k in response to request from the host 15. For example, the request may be a read request including a read command or a write request including a write command and data to write. The read command and the write command may be referred to as access commands.

In addition, the memory controller 100 may issue operation commands to the plurality of semiconductor memory devices 200a~200k for controlling the plurality of semiconductor memory devices 200a~200k.

In exemplary embodiments of the present inventive concept, each of the plurality of semiconductor memory devices 200a~200k is a memory device including resistive type memory cells such as a magnetoresistive random access memory (MRAM), a resistive random access memory (RRAM), a phase change random access memory (PRAM) and a ferroelectric random access memory (FRAM), etc. In exemplary embodiments of the present inventive concept, each of the plurality of semiconductor memory devices 200a~200k includes dynamic memory cells such as a dynamic random access memory (DRAM).

An MRAM is a nonvolatile computer memory based on magnetoresistance. An MRAM is different from a volatile RAM. For example, since an MRAM is nonvolatile, the MRAM may retain all stored data even when power is turned off.

Although a nonvolatile RAM may be slower than a volatile RAM, an MRAM has read and write response times comparable with read and write response times of a volatile RAM. An MRAM is low cost and has high capacity (like a DRAM, operates at high speed (like a static random access memory (SRAM), and is nonvolatile (like a flash memory).

In addition, an MRAM stores data by using magnetoresistance (or magnetoresistive) elements. For example, a magnetoresistance element is made of two magnetic layers, each having a magnetization.

An MRAM reads and writes data by using a magnetic tunnel junction pattern including two magnetic layers and an insulating film disposed between the two magnetic layers. A resistance value of the magnetic tunnel junction pattern may vary according to a magnetization direction of each of the magnetic layers. The MRAM may program or remove data by using the variation of the resistance value.

Figure 2:
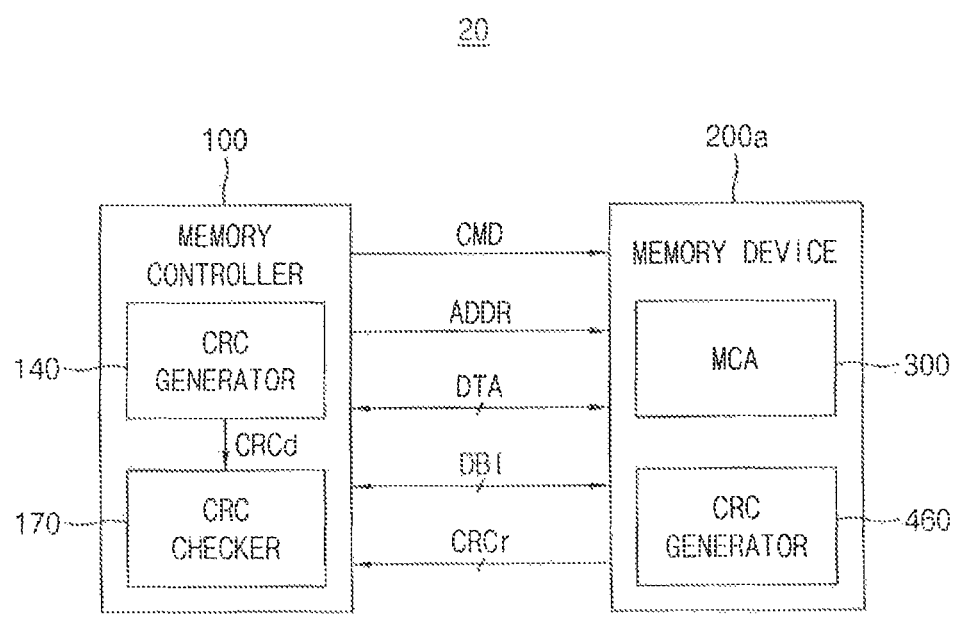
FIG. 2 is a block diagram illustrating a memory system shown in FIG. 1 according to exemplary embodiments of the present inventive concept.

FIG. 2 is a block diagram illustrating the memory system shown in FIG. 1 according to exemplary embodiments of the present inventive concept.

In FIG. 2, only one semiconductor memory device 200a in communication with the memory controller 100 is illustrated for convenience. However, the details discussed herein related to the one semiconductor memory device 200a may equally apply to the other semiconductor memory devices 200b~200k.

Referring to FIG. 2, the memory system 20 includes the memory controller 100 and the semiconductor memory device 200a. Each of the memory controller 100 and the semiconductor memory device 200a may be formed as a separate semiconductor chip or as a separate group of chips (e.g., the memory controller 100 and the semiconductor memory device 200a may be packaged together in a stack of the semiconductor chips).

The memory controller 100 transmits a command CMD and an address ADDR to the semiconductor memory device 200a and exchanges main data DTA with the semiconductor memory device 200a. In addition, the memory controller 100 exchanges data bus inversion (DBI) bits with the semiconductor memory device 200a. Each of the DBI bits may indicate whether each of a plurality of unit data included in the main data DTA is inverted. The memory controller 100 transmits final error detection code bits CRCd to the semiconductor memory device 200a.

The memory controller 100 includes an error detection code generation circuit (CRC generator) 140 and an error detector (CRC checker) 170. The error detection code generation circuit 140 generates the final error detection code bits CRCd based on the main data DTA and the DBI bits DBI which are to be transmitted to the semiconductor memory device 200a. The error detector 170 compares the final error detection code bits CRCd and return final error detection code bits CRCr to determine whether the main data DTA, which is transmitted to the semiconductor memory device 200a, includes errors.

The semiconductor memory device 200a includes a memory cell array 300 to store the main data DTA and an error detection code generation circuit (CRC generator) 460. The error detection code generation circuit 460 generates the return final error detection code bits CRCr based on the main data DTA and the DBI bits DBI, and transmits the return final error detection code bits CRCr to the memory controller 100.

Figure 3:
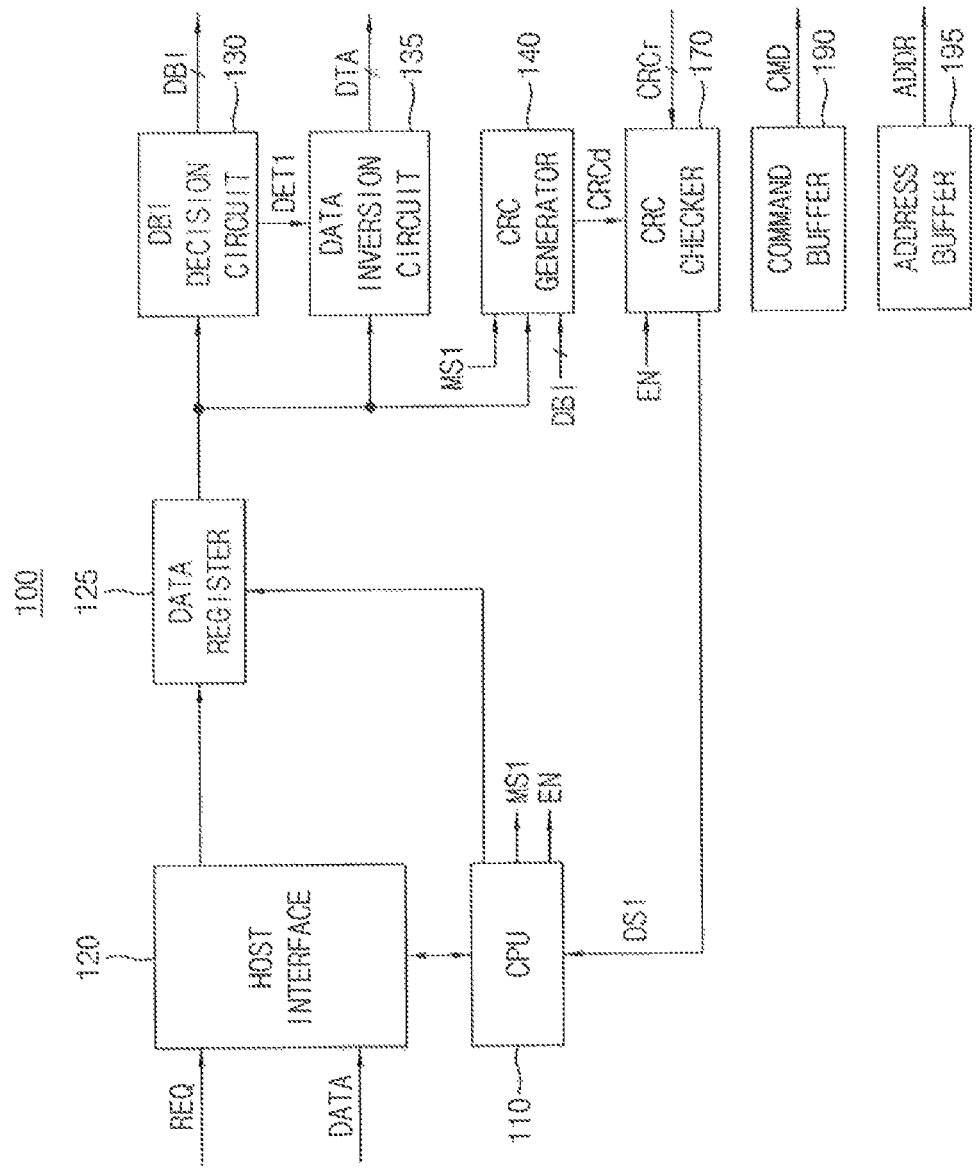
FIG. 3 is block diagram illustrating a memory controller in the memory system of FIG. 2 according to exemplary embodiments of the present inventive concept.

FIG. 3 is block diagram illustrating the memory controller in the memory system of FIG. 2 according to exemplary embodiments of the present inventive concept.

Referring to FIG. 3, the memory controller 100 includes a central processing unit (CPU) 110, a host interface 120, a data register 125, a data inversion decision circuit 130, a data inversion circuit 135, the error detection code generation circuit 140, the error detector 170, a command buffer 190 and an address buffer 195.

The host interface 120 receives a request REQ and data DATA and provides the data DATA to the data register 125.

The data register 125 continuously (or sequentially) outputs the data DATA to the data inversion decision circuit 130, the data inversion circuit 135 and the error detection code generation circuit 140. The data DATA may include a plurality of unit data (e.g., a plurality of byte-unit data).

The data inversion decision circuit 130 counts a number of first data bits having a first logic level, in each unit data of the data DATA, and provides a decision signal DET1 indicating whether to invert each unit data, based on the counting. The data inversion circuit 135 selectively inverts the unit data to output the main data DTA in response to the decision circuit DET1. For example, when the first logic level is a logic low level ('0'), the data inversion decision circuit 130 outputs the decision signal DET1 with the first logic level to the data inversion circuit 130 when a number of the first data bits in each unit data is greater than a number of second data bits having a second logic level (e.g., '1'). When the data inversion circuit 135 receives the decision signal DET1 having the first logic level, the data inversion circuit 135 inverts data bits of corresponding unit data. The data inversion decision circuit 130 outputs the decision signal DET1 for each of the unit data as the DBI bits DBI.

DBI is a technique for current reduction. For example, to reduce consumption of a large amount of current in transmission lines terminated with a power voltage while transmitting a low-level signal, if transmitted data includes a larger number of low-level bits than high-level bits, the data is converted to include half or fewer low-level bits than a total number of the bits, and an additional signal is transmitted indicating the data conversion.

The error detection code generation circuit 140 receives the data DATA and the DBI bits DBI, generates the final error detection code bits CRCd based on the data DATA and the DBI bits DBI according to a mode signal MS1 and provides the final error detection code bits CRCd to the error detector 170. The mode signal MS1 may designate a code rate mode. The error detection code generation circuit 160 may generate final error detection code bits CRCd having 16-bits or 8-bits according to the mode signal MS1. When the mode signal MS1 designates a first code rate mode, the error detection code generation circuit 160 may generate final error detection code bits CRCd having 16-bits. When the mode signal MS1 designates a second code rate mode, the error detection code generation circuit 160 may generate final error detection code bits CRCd having 8-bits.

The error detector 170 receives the final error detection code bits CRCd and the return final error detection code bits CRCr, compares corresponding bits of the final error detection code bits CRCd and the return final error detection code bits CRCr, and provides the CPU 110 with a detection signal DS1 indicating whether the main data DTA includes the errors based on a match (or mismatch) between the corresponding bits of the final error detection code bits CRCd and the return final error detection code bits CRCr.

When the detection signal DS1 indicates that the main data DTA includes the errors, the CPU 110 controls the data register 125 such that the data DATA and the DBI bits DBI are retransmitted to the semiconductor memory device 200a. The CPU 110 generates the mode signal MS1 and an enable signal EN, provides the mode signal MS1 to the error detection code generation circuit 140 and provides the enable signal EN to the error detector 170.

The command buffer 190 stores the command CMD corresponding to the request REQ and transmits the command CMD to the semiconductor memory device 200a under control of the CPU 110. The address buffer 195 stores the address ADDR and transmits the address ADDR to the semiconductor memory device 200a under control of the CPU 110.

The error detection code generation circuit 140 may include a first cyclic redundancy check (CRC) engine and a second CRC engine. The first CRC engine may generate first error detection code bits based on the first unit data and first DBI bits associated with the first unit data. The second CRC engine may generate second error detection code bits based on the second unit data and second DBI bits associated with the second unit data. The first CRC engine and the second CRC engine may reduce hardware overhead by using a same generation matrix.

Figure 4:
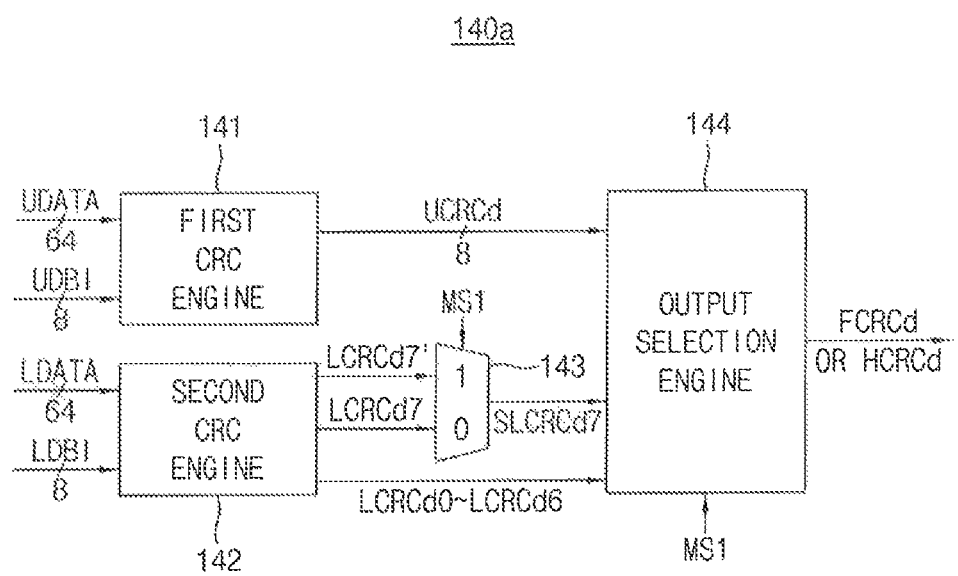
FIG. 4 is a block diagram illustrating an error detection code generation circuit in FIG. 3 according to exemplary embodiments of the present inventive concept.

FIG. 4 is a block diagram illustrating the error detection code generation circuit in FIG. 3 according to exemplary embodiments of the present inventive concept.

Referring to FIG. 4, an error detection code generation circuit 140a includes a first CRC engine 141, a second CRC engine 142, a multiplexer 143 and an output selection engine 144.

The first CRC engine 141 generates first error detection code bits UCRCd based on a plurality of first unit data UDATA and first DBI bits UDBI associated with the first unit data UDATA. The second CRC engine 142 generates second error detection code bits LCRCd0~LCRCd6 and LCRCd7 or LCRCd7' based on a plurality of second unit data LDATA and second DBI bits LDBI associated with the second unit data LDATA. The multiplexer 143 selects one of the error detection code bits LCRCd7 and LCRCd7' to output a selected error detection code bit SLCRCd7 in response to the mode signal MS1.

The output selection engine 144 outputs final error detection code bits FCRCd or HCRCd by selectively merging the first error detection code bits UCRCd and the second error detection code bits LCRCd0~LCRCd6 and SLCRCd7 in response to the mode signal MS1. For example, when the mode signal MS1 designates a first code rate mode (e.g., a full code rate mode), the multiplexer 143 selects the error detection code bit LCRCd7 of the error detection code bits LCRCd7 or LCRCd7', and the output selection engine 144 outputs the first error detection code bits UCRCd and the second error detection code bits LCRCd0~LCRCd7 as the final error detection code bits FCRCd. For example, when the mode signal MS1 designates a second code rate mode (e.g., a half code rate mode), the multiplexer 143 selects the error detection code bit LCRCd7' of the error detection code bits LCRCd7 or LCRCd7', and the output selection engine 144 outputs the first error detection code bits UCRCd and the second error detection code bits LCRCd0~LCRCd6 and LCRCd7' as the final error detection code bits HCRCd. Therefore, a number of the final error detection code bits FCRCd may be greater than a number of the final error detection code bits HCRCd.

The first CRC engine 141 and the second CRC engine 142 may use a same generation matrix. The second CRC engine 142 generates the error detection code bit LCRCd7' by inverting matrix elements of a row in a generation matrix, which is used for generating the error detection code bit LCRCd7. Therefore, the second CRC engine 142 may share matrix elements of other rows in the generation matrix for generating the error detection code bits LCRCd1~LCRCd6, and therefore, may reduce hardware overhead.

Figure 5:
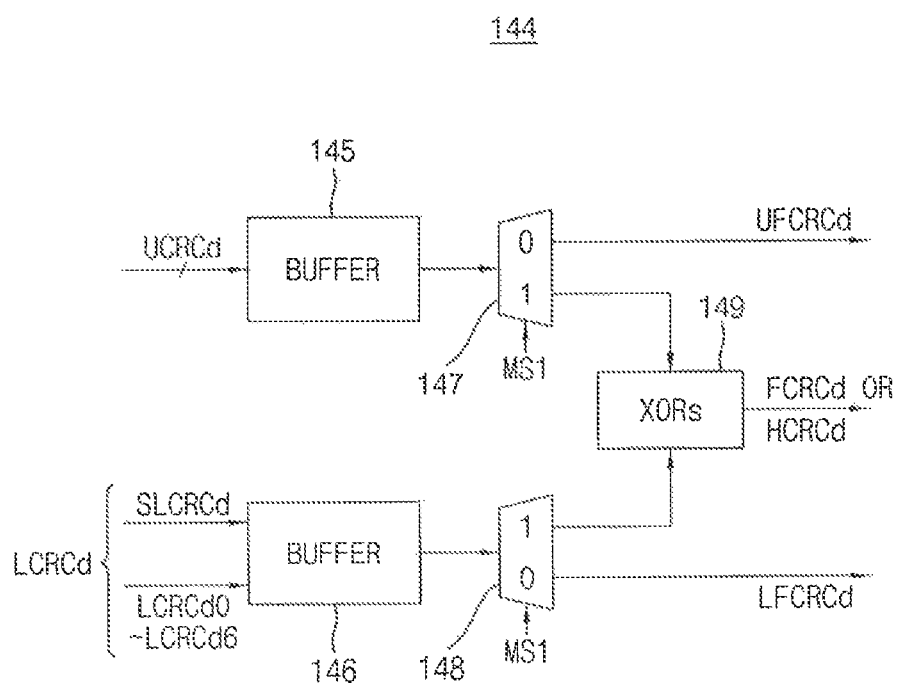
FIG. 5 is a block diagram illustrating an output selection engine in the error detection code generation circuit of FIG. 4 according to exemplary embodiments of the present inventive concept.

FIG. 5 is a block diagram illustrating the output selection engine in the error detection code generation circuit of FIG. 4 according to exemplary embodiments of the present inventive concept.

Referring to FIG. 5, the output selection engine 144 includes a first buffer 145, a second buffer 146, demultiplexers 147 and 148 and XOR logic 149.

The first buffer 145 stores the first error detection code bits UCRCd and the second buffer 146 stores the second error detection code bits LCRCd. The demultiplexer 147 is connected to the first buffer 145, and provides the first error detection code bits UCRCd as a segment UFCRCd of the final error detection code bits FCRCd, or provides the first error detection code bits UCRCd to the XOR logic 149 in response to the mode signal MS1. The demultiplexer 148 is connected to the second buffer 146, and provides the second error detection code bits LCRCd as a segment LFCRCd of the final error detection code bits FCRCd, or provides the second error detection code bits LCRCd to the XOR logic 149 in response to the mode signal MS1. The XOR logic 149 merges the first error detection code bits UCRCd and the second error detection code bits LCRCd to output the final error detection code bits FCRCd or HCRCd.

Figure 6:
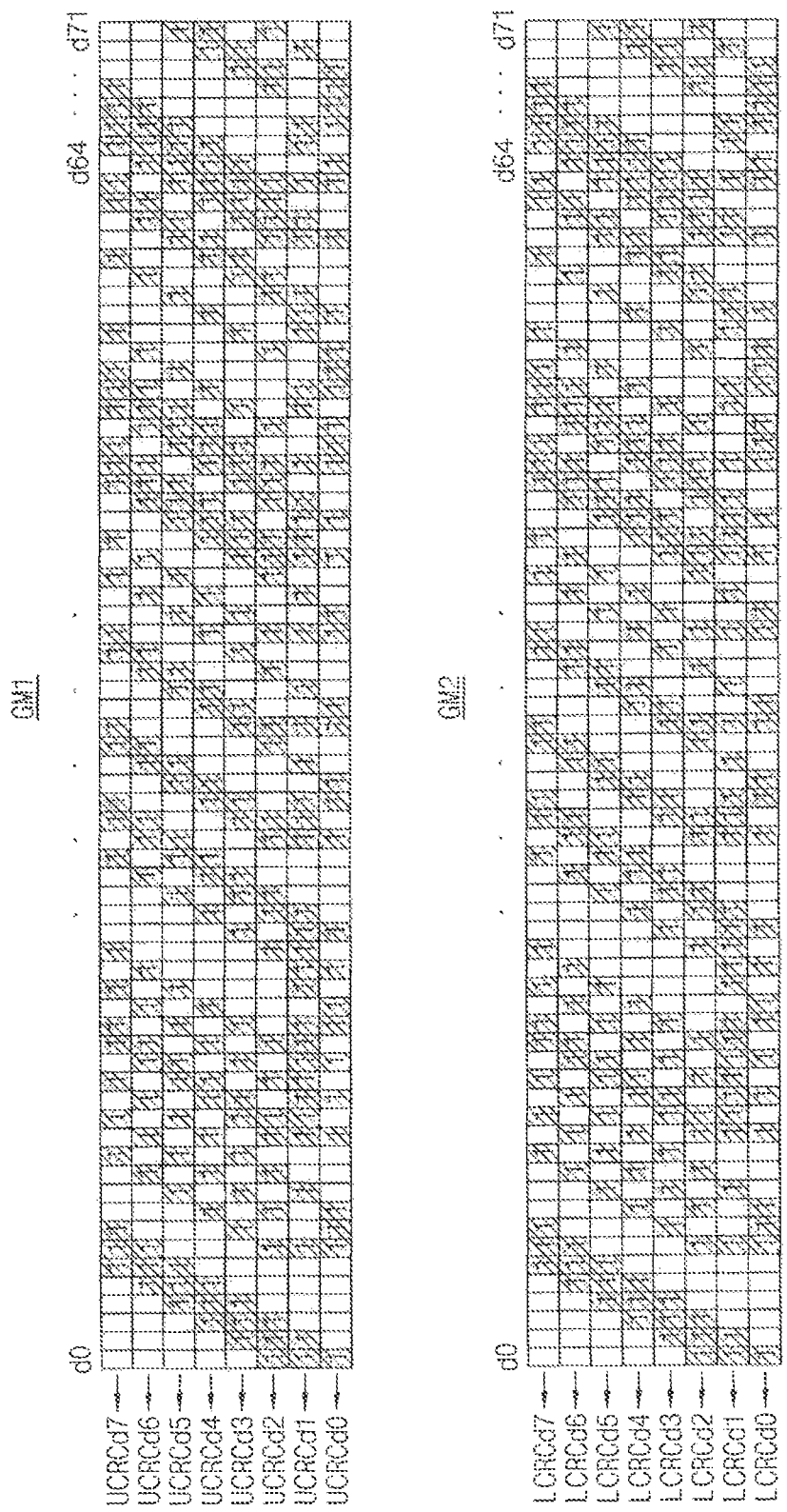
FIG. 6 illustrates a first generation matrix and a second generation matrix used respectively in a first CRC engine and a second CRC engine of the present inventive concept.

FIG. 6 illustrates a first generation matrix and a second generation matrix used respectively in the first CRC engine and the second CRC engine according to an exemplary embodiment of the present inventive concept.

Referring to FIG. 6, it is noted that a first generation matrix GM1 is the same as a second generation matrix GM2. Each row of the first generation matrix GM1 is used for generating each of bits UCRCd0~UCRCd7 of the first error detection code bits UCRCd and each row of the second generation matrix GM2 is used for generating each of bits LCRCd0~LCRCd7 of the second error detection code bits LCRCd. Corresponding bits are generated by XORing some of data bits d0~d63 and some of DBI bits d64~d71, which have a matrix element with '1' in the generating matrix. The first generation matrix GM1 and the second generation matrix GM2 are used when the mode signal MS1 designates a first code rate mode. The first generation matrix GM1 and the second generation matrix GM2 may employ CRC-0 polynomials. The error detection code generation circuit 140a may detect a 1-bit error, a 2-bit error odd-numbered bit error and an 8-bit symbol error in the first code rate mode.

Figure 7:
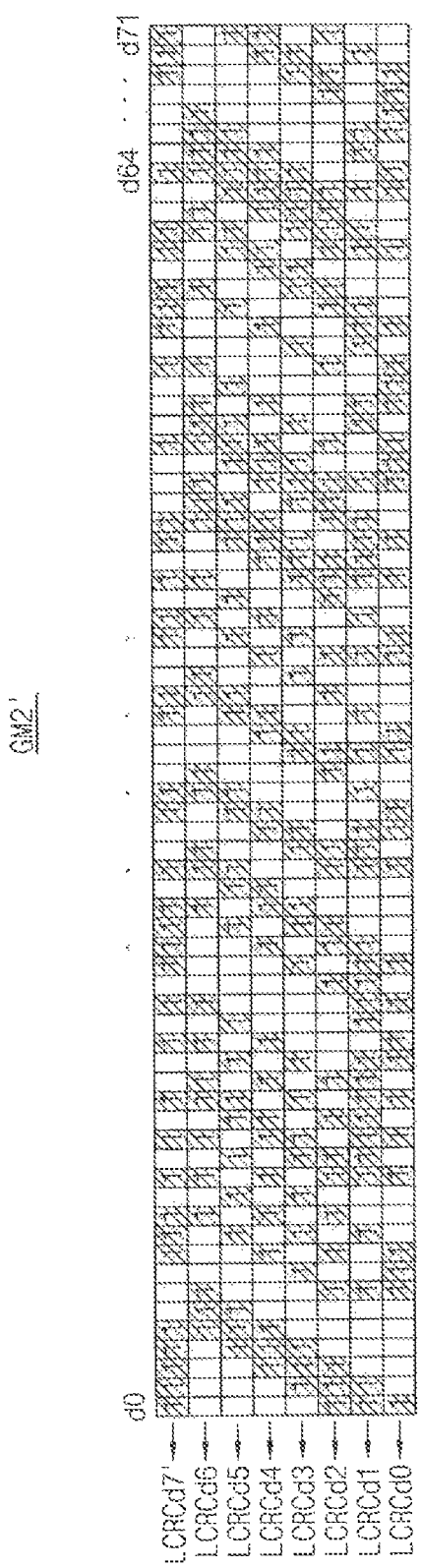
FIG. 7 illustrates a second modified matrix used in the second CRC engine in FIG. 4 of the present inventive concept.

FIG. 7 illustrates a second modified matrix used in the second CRC engine in FIG. 4 according to exemplary embodiments of the present inventive concept.

Referring to FIG. 7, a second modified matrix GM2' is generated by inverting matrix elements of a row associated with a most significant bit LCRCd7 of the second error detection code bits LCRCd in the second generation matrix GM2. The error detection code bit LCRCd7' is generated by XORing some of data bits d0~d63 and some of DBI bits d64~d71, which have a matrix element with '1' in an eighth row in the second modified matrix GM2'. The second modified matrix GM2' uses most of the rows of the second generation matrix GM2 while inverting the matrix elements of a row associated with a most significant bit LCRCd7, and therefore, may reduce a hardware overhead. The second modified matrix GM2' of FIG. 7 is used when the mode signal MS1 designates a first sub code rate mode of a second code rate mode. The error detection code generation circuit 140a may detect a 2-bit error, in the first sub code rate mode.

Figure 8:
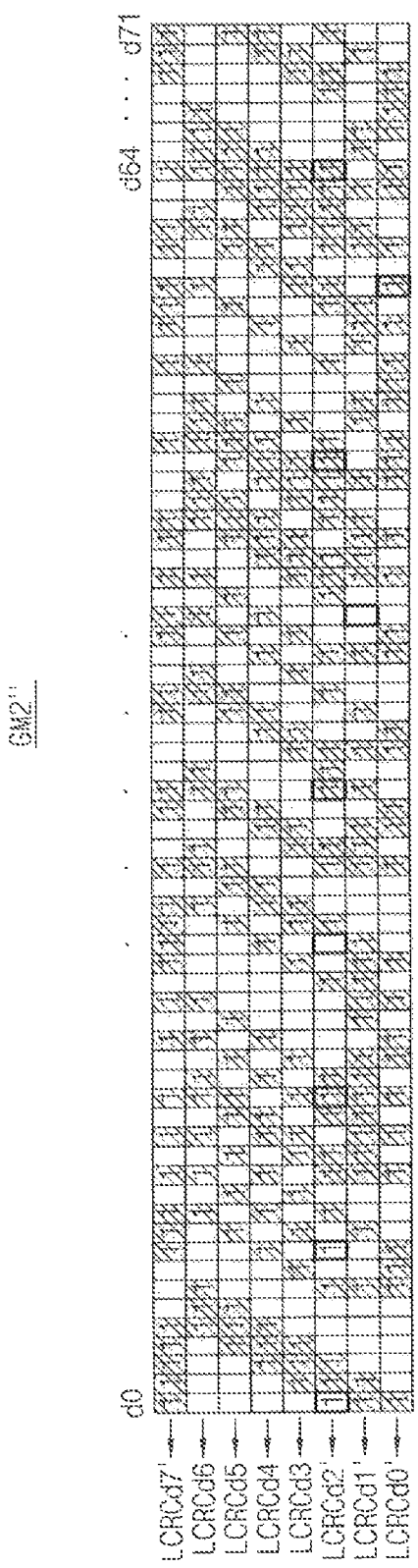
FIG. 8 illustrates a second modified matrix used in the second CRC engine in FIG. 4 of the present inventive concept.

FIG. 8 illustrates a second modified matrix used in the second CRC engine in FIG. 4 according to an exemplary embodiment of the present inventive concept.

Referring to FIG. 8, a second modified matrix GM2" is generated by inverting matrix elements of rows associated with a most significant bit LCRCd7 and by inverting some of matrix elements associated with the error detection code bits LCRCd0, LCRCd1 and LCRCd2, of the second error detection code bits LCRCd in the second generation matrix. The error detection code bits LCRCd0', LCRCd1', LCRCd2', LCRCd3, LCRCd4, LCRCd5, LCRCd5, LCRCd6 and LCRCd7' are generated by XORing some of data bits d0~d63 and some of DBI bits d64~d71, which have a matrix element with '1' in rows in the second modified matrix GM2'. The second modified matrix GM2" uses most of the rows of the second generation matrix GM2 while inverting some of the matrix elements of some rows in the second generation matrix GM2, and thus, may reduce a hardware overhead. The second modified matrix GM2" of FIG. 8 is used when the mode signal MS1 designates a second sub code rate mode of a second code rate mode. The error detection code generation circuit 140a may detect a 1-bit error, a 2-bit error odd-numbered bit error and an 8-bit symbol error in the second sub code rate mode. Therefore, an error detection capability of the error detection code generation circuit 140a in the second sub code rate mode is greater than an error detection capability of the error detection code generation circuit 140a in the first sub code rate mode. In addition, an error detection capability of the error detection code generation circuit 140a in the second code rate mode using the modified matrix is greater than an error detection capability of the error detection code generation circuit 140a in the second code rate mode not using the modified matrix.

Figure 9:
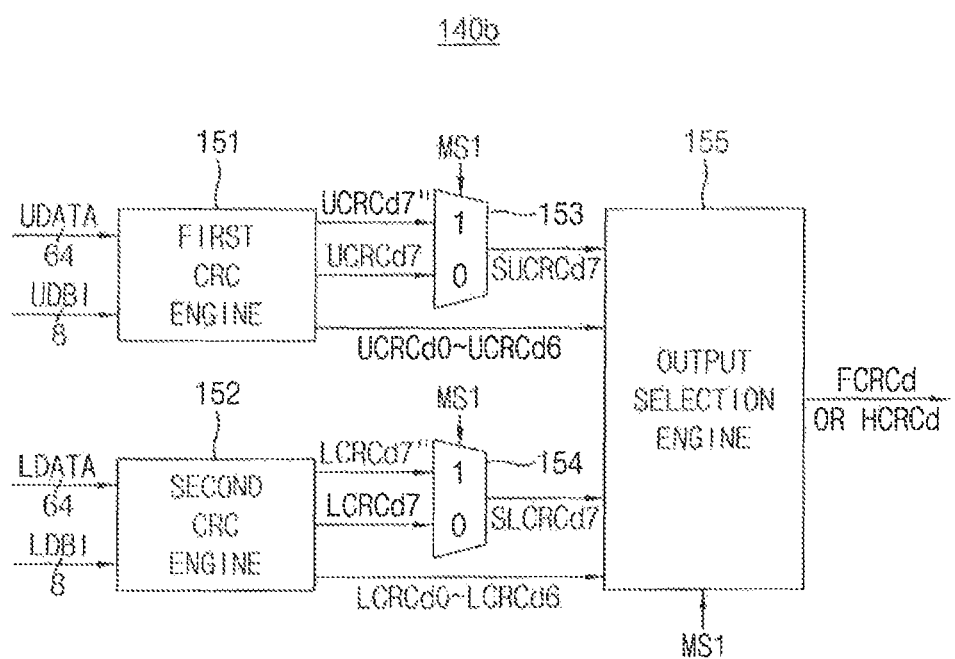
FIG. 9 is a block diagram illustrating the error detection code generation circuit in FIG. 3 according to exemplary embodiments of the present inventive concept.

FIG. 9 is a block diagram illustrating the error detection code generation circuit in FIG. 3 according to exemplary embodiments of the present inventive concept.

Referring to FIG. 9, an error detection code generation circuit 140b includes a first CRC engine 151, a second CRC engine 152, multiplexers 153 and 154, and an output selection engine 155.

The first CRC engine 151 generates first error detection code bits UCRCd0~UCRCd6 and UCRCd7 or UCRCd7" based on a plurality of first unit data UDATA and first DBI bits UDBI associated with the first unit data UDATA. The second CRC engine 152 generates second error detection code bits LCRCd0~LCRCd6 and LCRCd7 or LCRCd7" based on a plurality of second unit data LDATA and second DBI bits LDBI associated with the second unit data LDATA. The multiplexer 153 selects one of the error detection code bits UCRCd7 or UCRCd7" to output a selected error detection code bit SUCRCd7 in response to the mode signal MS1. The multiplexer 154 selects one of the error detection code bits LCRCd7 and LCRCd7" to output a selected error detection code bit SLCRCd7 in response to the mode signal MS1.

The output selection engine 155 outputs final error detection code bits FCRCd or HCRCd by selectively merging the first error detection code bits UCRCd0~UCRCd6 and SUCRCD7 and the second error detection code bits LCRCd0~LCRCd6 and SLCRCd7 in response to the mode signal MS1. For example, when the mode signal MS1 designates a first code rate mode (e.g., a full code rate mode), the output selection engine 155 outputs the first error detection code bits UCRCd0~UCRCd7 and the second error detection code bits LCRCd0~LCRCd7 as the final error detection code bits FCRCd by merging corresponding bits of the first error detection code bits UCRCd0~UCRCd7 and the second error detection code bits LCRCd0~LCRCd7. For example, when the mode signal MS1 designates a second code rate mode (e.g., a half code rate mode), the output selection engine 155 outputs final error detection code bits HCRCd by merging corresponding bits of the first error detection code bits UCRCd and the second error detection code bits LCRCd. Therefore, a number of the final error detection code bits FCRCd may be greater than a number of the final error detection code bits HCRCd.

The first CRC engine 151 and the second CRC engine 152 may use a same generation matrix. The first CRC engine 151 and second CRC engine 152 generate the error detection code bit UCRCd7" and the error detection code bit LCRCd7" respectively by inverting matrix elements of a row in a generation matrix, which is used for generating the error detection code bit UCRCd7 and the error detection code bit LCRCd7 respectively. Therefore, the first CRC engine 151 and the second CRC engine 152 may share matrix elements of other rows for generating the error detection code bits in the generation matrix, and therefore, may reduce hardware overhead.

Figure 10:
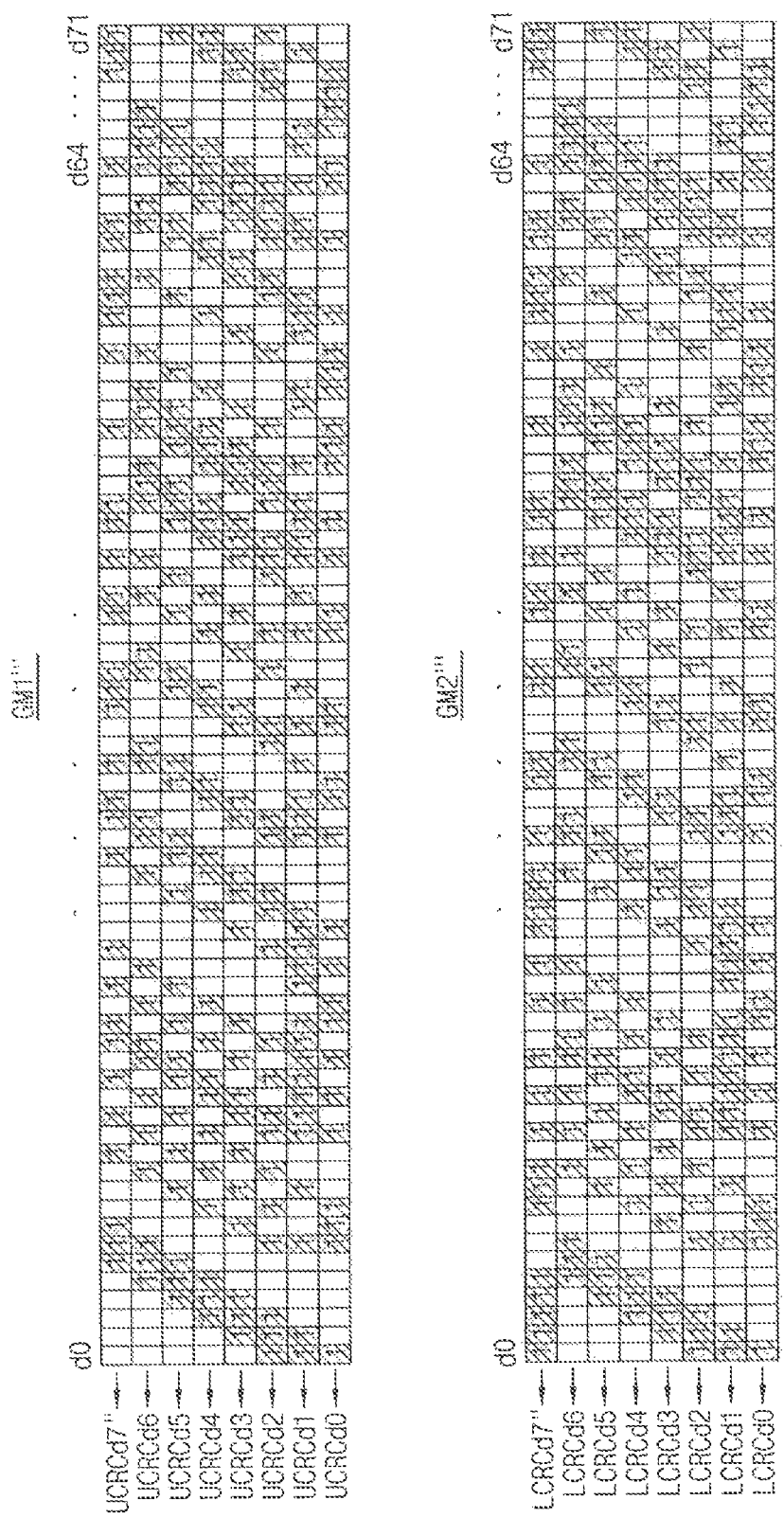
FIG. 10 illustrates a first modified matrix and a second modified matrix used respectively in the first CRC engine and the second CRC engine in FIG. 9 of the present inventive concept.

FIG. 10 illustrates a first modified matrix and a second modified matrix used respectively in the first CRC engine and the second CRC engine in FIG. 9 according to exemplary embodiments of the present inventive concept.

Referring to FIG. 10, a first modified matrix GM1''' is generated by inverting some of matrix elements of a row associated with a most significant bit UCRCd7 in the first generation matrix GM1. The second modified matrix GM2''' is generated by inverting some of matrix elements of a row associated with a most significant bit LCRCd7 in the second generation matrix GM2. The first modified matrix GM1''' and the second modified matrix GM2''' are used in a third sub code rate mode of the second code rate mode.

Figure 11:
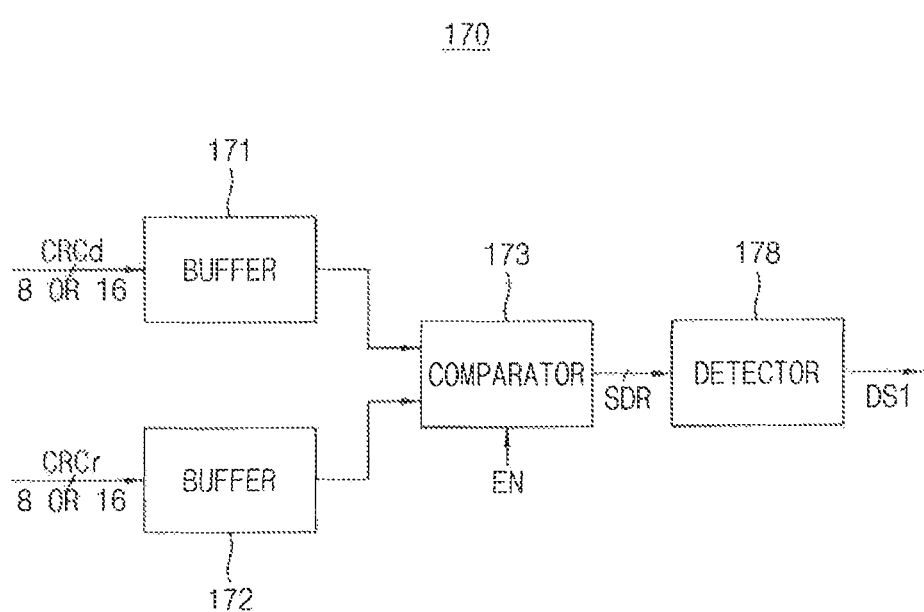
FIG. 11 is a block diagram illustrating an error detector in the memory controller of FIG. 3 according to exemplary embodiments of the present inventive concept.

FIG. 11 is a block diagram illustrating the error detector in the memory controller of FIG. 3 according to exemplary embodiments of the present inventive concept.

Referring to FIG. 11, the error detector 170 includes a first buffer 171, a second buffer 172, a comparator 173 and a detector 178. The first buffer 171 includes the final error detection code bits CRCd with 8-bits or 16-bits according to the code rate mode. The second buffer 172 includes the return final error detection code bits CRCr with 8-bits or 16-bits according to the code rate mode. The comparator 173 is connected to the first buffer 171 and the second buffer 172. The comparator 173 compares corresponding bits of the final error detection code bits CRCd and the return final error detection code bits CRCr and generates syndrome data SDR which indicates a match between corresponding bits of the final error detection code bits CRCd and the return final error detection code bits CRCr. The detector 178 generates the detection signal DS1 which indicates whether the main data DTA includes the errors, in response to the syndrome data SDR. The comparator 173 receives the enable signal EN.

Figure 12:
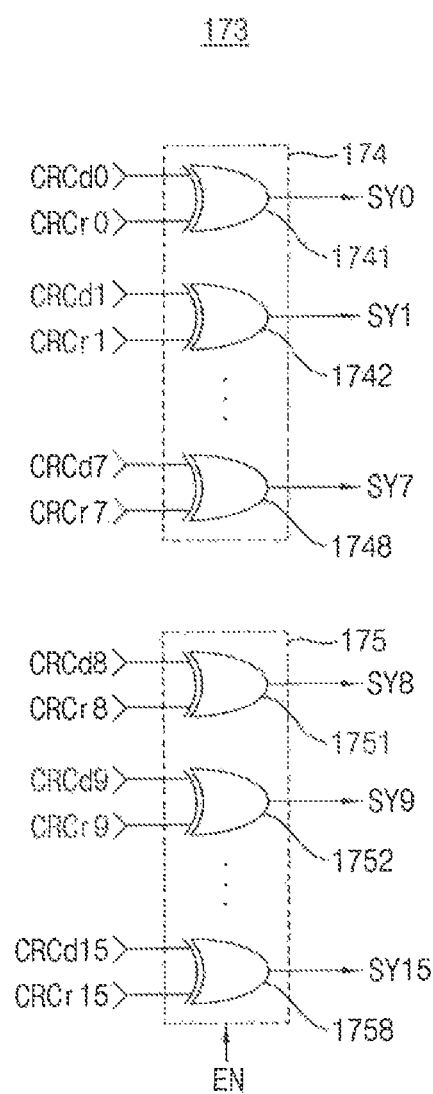
FIG. 12 is a circuit diagram illustrating a comparator in FIG. 11 according to exemplary embodiments of the present inventive concept.

FIG. 12 is a circuit diagram illustrating the comparator in FIG. 11 according to exemplary embodiments of the present inventive concept.

Referring to FIG. 12, the comparator 173 includes a first comparison unit 174 and a second comparison unit 175. The second comparison unit 175 may be activated in response to the enable signal EN in the first code rate mode. The first comparison unit 174 includes a plurality of XOR gates 1741~1748 and the second comparison unit 175 includes a plurality of XOR gates 1751~1758. The XOR gates 1741~1748 perform an XOR operation on corresponding bits of final error detection code bits CRCd0~CRCd7 and the return final error detection code bits CRCr0~CRCr7 and outputs corresponding syndrome bits SY0~SY7. The XOR gates 1751~1758 perform an XOR operation on corresponding bits of final error detection code bits CRCd8~CRCd15 and the return final error detection code bits CRCr8~CRCr15 and outputs corresponding syndrome bits SY8~SY15 in the first code rate mode.

FIG. 13 illustrates the main data and the DBI bits when the semiconductor memory device in FIG. 2 operates in an X8 mode according to exemplary embodiments of the present inventive concept.

Referring to FIG. 13, a data bit output through each pin for each burst is shown. First to 64-th data bits d0-d63 are data output in response to one read command. The 1st to 64th data bits d0-d63 may be loaded on 64 data lines. The first DQ pin DQ0 may sequentially output first to 8-th data bits d0-d7 for the first to 8-th bursts, respectively, the second through 8-th DQ pins DQ1~DQ7 may operate similarly. The DBI pin DBIP may sequentially output the first to 8-th DBI bits d64-d71 for the first to 8th bursts, respectively.

Figure 14:
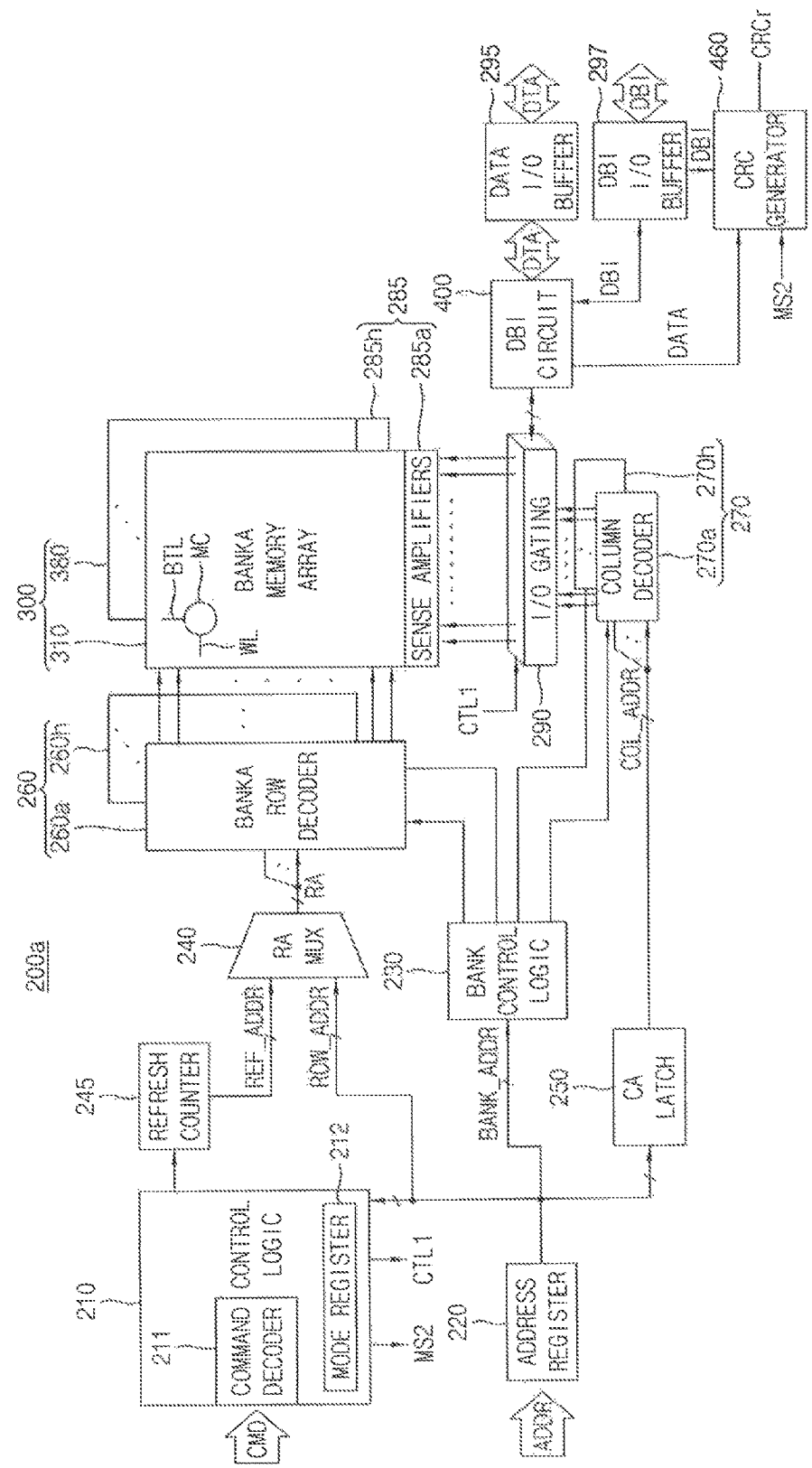
FIG. 14 is a block diagram illustrating the semiconductor memory device in FIG. 2 according to exemplary embodiments of the present inventive concept.

FIG. 14 is a block diagram illustrating the semiconductor memory device in FIG. 2 according to exemplary embodiments of the present inventive concept.

Referring to FIG. 14, the semiconductor memory device 200a includes a control logic circuit 210, an address register 220, a bank control logic 230, a refresh counter 245, a row address multiplexer 240, a column address latch 250, a row decoder 260, a column decoder 270, the memory cell array 300, a sense amplifier unit 285, an input/output (I/O) gating circuit 290, a DBI circuit 400, a data input/output (I/O) buffer 295, a DBI I/O buffer 297 and an error detection code generation circuit 460.

In exemplary embodiments of the present inventive concept, the refresh counter 245 may not be included in the semiconductor memory device 200a. For example, when the memory cell array 300 includes a plurality of resistive type memory cells, the refresh counter 245 may be omitted from the semiconductor memory device 200a.

The memory cell array 300 includes first through eighth bank arrays 310~380. The row decoder 260 includes first through eighth bank row decoders 260a~260h respectively coupled to the first through eighth bank arrays 310~380, the column decoder 270 includes first through eighth bank column decoders 270a~270h respectively coupled to the first through eighth bank arrays 310~380, and the sense amplifier unit 285 includes first through eighth bank sense amplifiers 285a~285h respectively coupled to the first through eighth bank arrays 310~380. Each of the first through eighth bank arrays 310~380 includes a plurality of memory cells MC coupled to a plurality of word-lines WL and a plurality of bit-lines BTL. Although the semiconductor memory device 200a is illustrated in FIG. 14 as including eight banks, the semiconductor memory device 200a may include any number of banks. For example, there may be more than eight banks or less than eight banks.

The address register 220 receives an address ADDR including a bank address BANK_ADDR, a row address ROW_ADDR and a column address COL_ADDR from the memory controller 100. The address register 220 provides the received bank address BANK_ADDR to the bank control logic 230, provides the received row address ROW_ADDR to the row address multiplexer 240, and provides the received column address COL_ADDR to the column address latch 250.

The bank control logic 230 generates bank control signals in response to the bank address BANK_ADDR. One of the first through eighth bank row decoders 260a~260h corresponding to the bank address BANK_ADDR is activated in response to the bank control signals, and one of the first through eighth bank column decoders 270a~270h corresponding to the bank address BANK_ADDR is activated in response to the bank control signals.

The row address multiplexer 240 receives the row address ROW_ADDR from the address register 220, and receives a refresh row address REF_ADDR from the refresh counter 245. The row address multiplexer 240 selectively outputs the row address ROW_ADDR or the refresh row address REF_ADDR as a row address RA. The row address RA that is output from the row address multiplexer 240 is applied to the first through eighth bank row decoders 260a~260h.

The activated one of the first through eighth bank row decoders 260a~260h decodes the row address RA that is output from the row address multiplexer 240, and activates a word-line corresponding to the row address RA. For example, the activated bank row decoder applies a word-line driving voltage to the word-line corresponding to the row address RA. The column address latch 250 receives the column address COL_ADDR from the address register 220, and temporarily stores the received column address COL_ADDR. In exemplary embodiments of the present inventive concept, in a burst mode, the column address latch 250 generates column addresses that increment from the received column address COL_ADDR. The column address latch 250 applies the temporarily stored or generated column address to the first through eighth bank column decoders 270a~270h.

The activated one of the first through eighth bank column decoders 270a~270h decodes the column address COL_ADDR that is output from the column address latch 250, and controls the I/O gating circuit 290 to output data corresponding to the column address COL_ADDR. The I/O gating circuit 290 includes a circuitry for gating input/output data, and further includes read data latches for storing data that is output from the first through eighth bank arrays 310~380, and write drivers for writing data to the first through eighth bank arrays 310~380.

The data I/O buffer 295 may provide the main data DTA from the memory controller 100 to the DBI circuit 400 in a write operation and may provide the main data DTA from the DBI circuit 400 to the memory controller 100 in a read operation.

The DBI I/O buffer 297 provides the DBI bits DBI to the DBI circuit 400 or provides the DBI bits DBI from the DBI circuit 400 to the memory controller 100. The error detection code generation circuit 460 generates the return error detection code bits CRCr based on the data DATA from the DBI circuit 400 and the DBI bits DBI from the DBI I/O buffer 297 according to a mode signal MS2 and provides the return error detection code bits CRCr to the memory controller 100.

The control logic circuit 210 may control operations of the semiconductor memory device 200a. For example, the control logic circuit 210 may generate control signals for the semiconductor memory device 200a to perform a write operation or a read operation. The control logic circuit 210 includes a command decoder 211 that decodes a command CMD received from the memory controller 100 and a mode register 212 that sets an operation mode of the semiconductor memory device 200a.

For example, the command decoder 211 may generate the control signals corresponding to the command CMD by decoding a write enable signal (/WE), a row address strobe signal (/RAS), a column address strobe signal (/CAS), a chip select signal (/CS), etc. The control logic circuit 210 may generate the mode signal MS2 indicating a code rate mode and may generate a first control signal CTL1 to control the I/O gating circuit 290 by decoding the command CMD.

Figure 15:
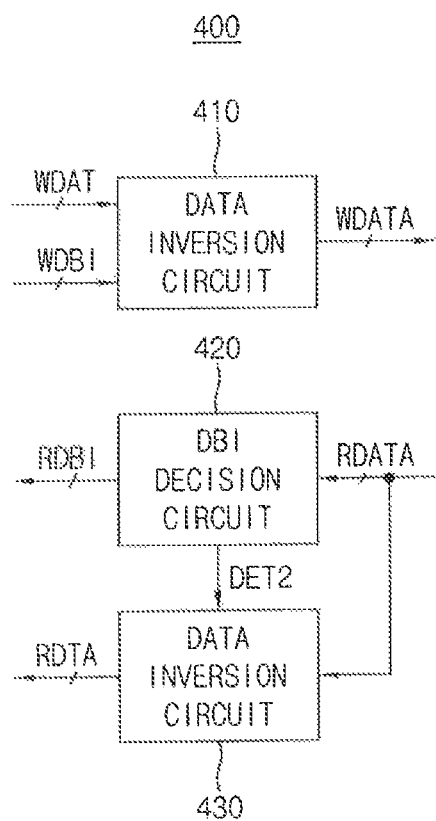
FIG. 15 is a block diagram illustrating a DBI circuit in the semiconductor memory device of FIG. 14 according to exemplary embodiments of the present inventive concept.

FIG. 15 is a block diagram illustrating the DBI circuit in the semiconductor memory device of FIG. 14 according to exemplary embodiments of the present inventive concept.

Referring to FIG. 15, the DBI circuit 400 includes a first data inversion circuit 410, a data inversion decision circuit 420 and a second data inversion circuit 430. The first data inversion circuit 410 selectively inverts each of a plurality of unit data in a write main data WDTA based on write DBI bits WDBI from the memory controller 100 and outputs a write data WDATA. The data inversion decision circuit 420 counts a number of first data bits having a first logic level, in each unit data of a read data RDATA, and provides the second data inversion circuit 430 with a decision signal DET2 indicating whether to invert each unit data of the read data RDATA, based on the counting. The second data inversion circuit 430 selectively inverts each unit data of the read data RDATA in response to the decision signal DET2 and outputs a read main data RDTA. The data inversion decision circuit 420 outputs read DBI bits.

FIGS. 16A to 16E are circuit diagrams of the memory cell shown in FIG. 14, according to exemplary embodiments of the present inventive concept.

Figure 16A:
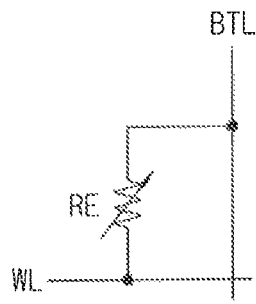
FIGS. 16A, 16B, 16C, 16D and 16E are circuit diagrams of a memory cell shown in FIG. 14, according to exemplary embodiments of the present inventive concept.
Figure 16B:
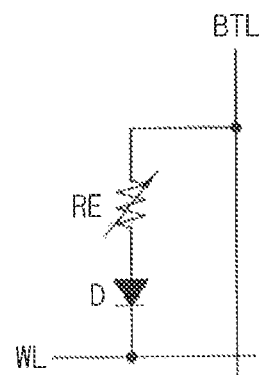
Figure 16C:
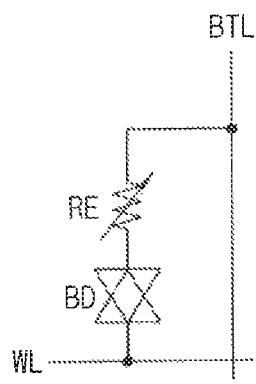
Figure 16D:
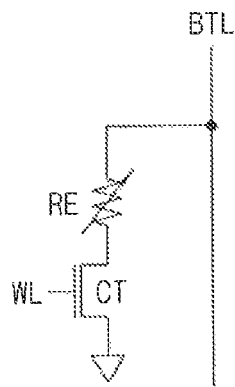
Figure 16E:
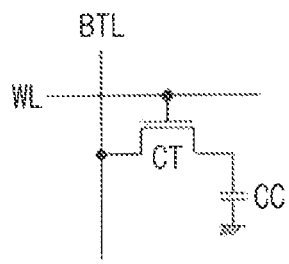

FIGS. 16A to 16D illustrate memory cells MC which are implemented with resistive type memory cells and FIG. 16E illustrates a memory cell MC which is implemented with a dynamic memory cell.

Referring to FIG. 16A, a memory cell MC may include a resistive element RE connected to a bit-line BTL and a word-line WL.

Referring to FIG. 16B, a memory cell MC may include a resistive element RE and a diode D. The resistive element RE may include a resistive material for data storage. The diode D may be coupled between the resistive element RE and word-line WL, and the resistive element RE may be coupled between a bit-line BTL and the diode D.

Referring to FIG. 16C, a memory cell MC may include a resistive element RE and a bidirectional diode BD. The resistive element RE may include a resistive material for data storage. The bidirectional diode BD may be coupled between the resistive element RE and a word-line WL, and the resistive element RE may be coupled between a bit-line BTL and the bidirectional diode BD.

Referring to FIG. 16D, a memory cell MC may include a resistive element RE and a transistor CT. The transistor CT may be a selection element (or a switching element) that supplies current to the resistive element RE or cuts off the current supply to the resistive element RE according to a voltage of a word-line WL. The transistor CT may be coupled between the resistive element RE and a word-line WL, and the resistive element RE may be coupled between a bit-line BTL and the transistor CT.

Referring to FIG. 16E, a memory cell MC may include a cell capacitor CC and a transistor CT. The transistor CT may be a selection element (or a switching element) that connects/disconnects the cell capacitor CC to/from a bit-line BTL according to a voltage of a word-line WL. The transistor CT may be coupled between the cell capacitor CC, the word-line WL and the bit-line BTL, and the cell capacitor CC may be coupled between the transistor CT and a plate voltage.

Figure 17:
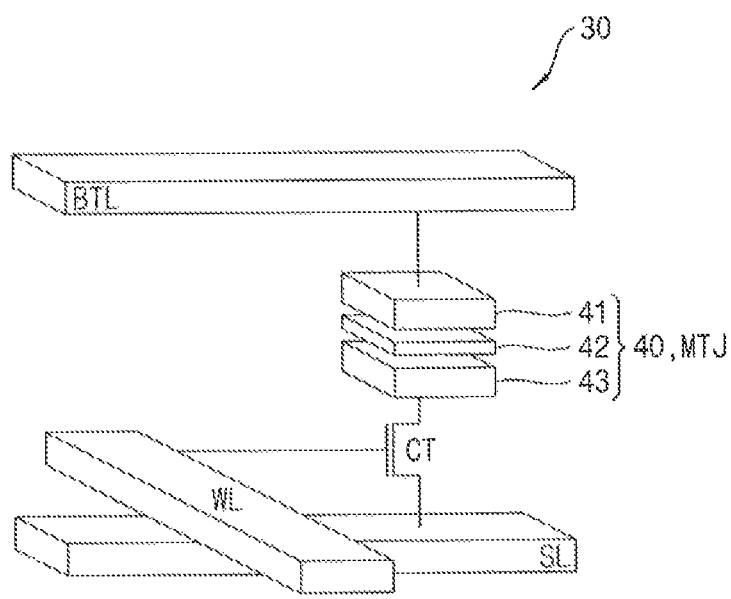
FIG. 17 illustrates the memory cell shown in FIG. 14, according to exemplary embodiments of the present inventive concept.

FIG. 17 illustrates the memory cell shown in FIG. 14, according to exemplary embodiments of the present inventive concept. The memory cell may be a spin transfer torque (STT)-MRAM cell.

Referring to FIG. 17, an STT-MRAM cell 30 may include a magnetic tunnel junction (MTJ) element 40 and a cell transistor CT. A gate of the cell transistor CT is connected to a word-line WL and one electrode of the cell transistor CT is connected through the MTJ element 40 to a bit-line BTL.

In addition, the other electrode of the cell transistor CT is connected to a source line SL.

The MTJ element 40 may include a free layer 41, a pinned layer 43, and a tunnel layer 42 disposed between the free layer 41 and the pinned layer 43. A magnetization direction of the pinned layer 43 may be fixed, and a magnetization direction of the free layer 41 may be parallel to or anti-parallel to the magnetization direction of the pinned layer 43 according to written data. To fix the magnetization direction of the pinned layer 43, an anti-ferromagnetic layer may be further provided, for example.

Figure 18:
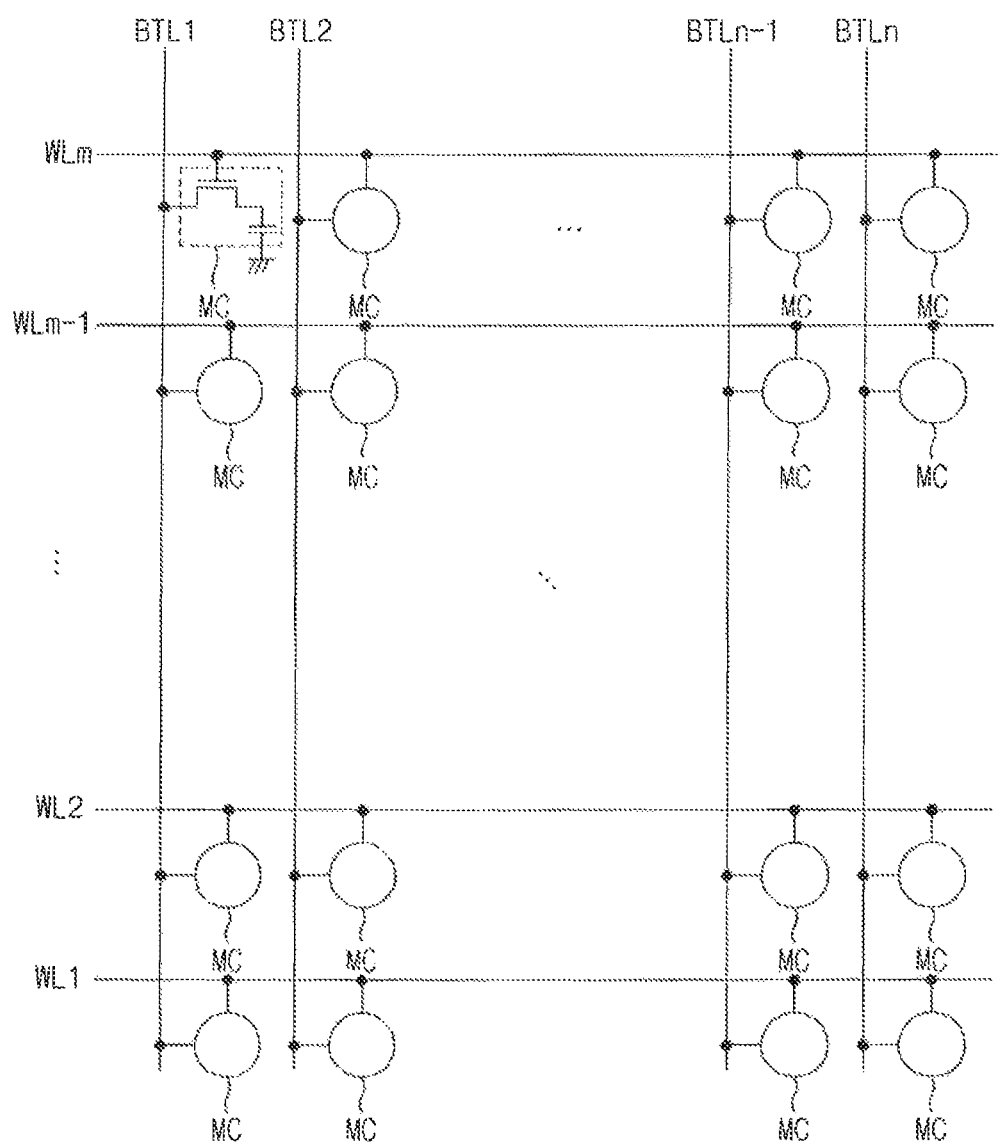
FIG. 18 illustrates a first bank array in the semiconductor memory device of FIG. 14 of the present inventive concept.

FIG. 18 illustrates the first bank array in the semiconductor memory device of FIG. 14 according to exemplary embodiments of the present inventive concept.

Referring to FIG. 18, the first bank array 310 includes a plurality of word-lines WL1~WLm (m is a natural number greater than two), a plurality of bit-lines BTL1~BTLn (n is a natural number greater than two), and a plurality of memory cells MCs disposed near intersections between the word-lines WL1~WLm and the bit-lines BTL1~BTLn.

Figure 19:
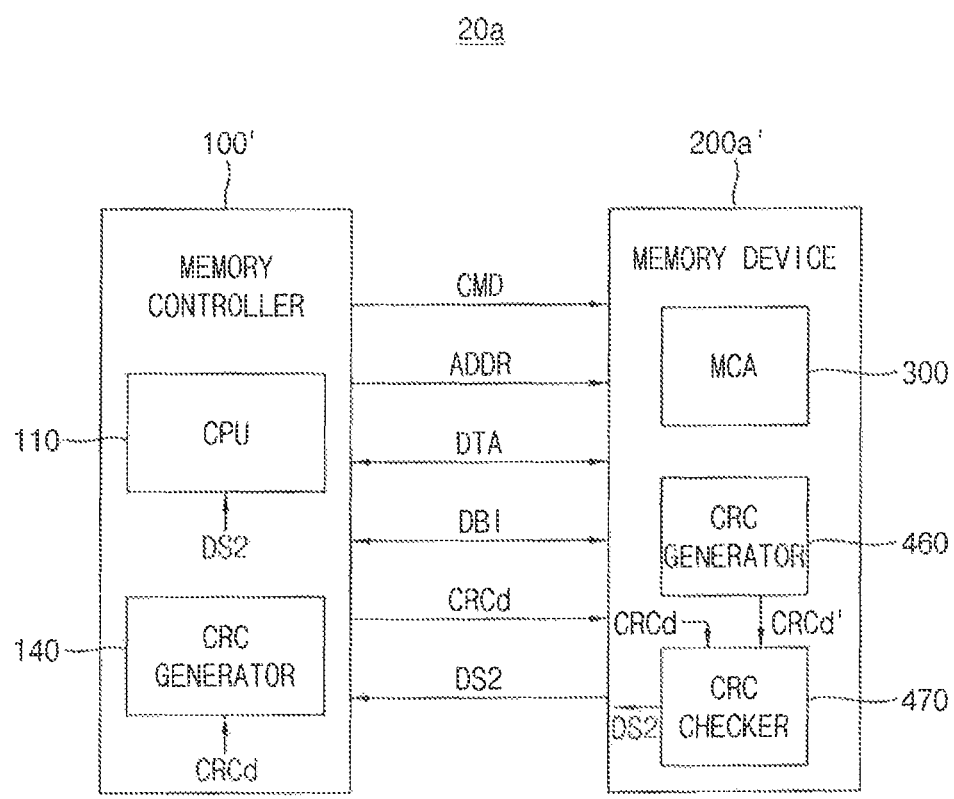
FIG. 19 is a block diagram illustrating a memory system according to exemplary embodiments of the present inventive concept.

FIG. 19 is a block diagram illustrating a memory system according to exemplary embodiments of the present inventive concept.

Referring to FIG. 19, a memory system 20a includes the memory controller 100' and the semiconductor memory device 200a'.

The memory system 20a of FIG. 19 differs from the memory system 20 of FIG. 2 in that the error detector 470 is included in the semiconductor memory device 200a' instead of the memory controller 100'. In addition, the semiconductor memory device 200a' transmits the detection signal DS2 instead of the return error detection code bits CRCr to the memory controller 100'. When the detection signal DS2 indicates that the main data DTA includes errors, the memory controller 100' retransmits the main data DTA and the DBI bits DBI to the semiconductor memory device 200a'.

The memory controller 100' includes the CPU 110 and the error detection code generation circuit 140. The error detection code generation circuit 140 generates transmission final error detection code bits CRCd based on the main data DTA and the DBI bits DBI and transmits the transmission final error detection code bits CRCd to the semiconductor memory device 200a' via data pins of the semiconductor memory device 200a'.

The semiconductor memory device 200a' includes the memory cell array 300, the error detection code generation circuit 460 and the error detector 470. The error detection code generation circuit 460 generates final error detection code bits CRCd' based on the main data DTA and the DBI bits DBI from the memory controller 100' and provides the final error detection code bits CRCd' to the error detector 470. The error detector 470 compares corresponding bits of the transmission final error detection code bits CRCd and the final error detection code bits CRCd', and transmits, to the memory controller 100', the decision signal DS2 indicating whether the main data DTA includes the errors based on a match of the corresponding bits of the transmission final error detection code bits CRCd and the final error detection code bits CRCd'. The error detector 470 also provides the decision signal DS2 to the control logic circuit 210 in FIG. 14. In this case, the control logic circuit 210 may block storing of the main data DTA through the first control signal CTL1 when the main data DTA includes the errors.

The descriptions made with reference to FIGS. 4 through 10 may be applied to each of the error detection code generation circuits 140 and 460. Therefore, each of the error detection code generation circuits 140 and 460 generates error detection code bits having a different number of bits according to the code rate mode. In addition, the error detector 470 may employ the error detector 170 of FIG. 11. Therefore, each of the error detection code generation circuits 140 and 460 includes a first CRC engine and a second CRC engine, which both use a same generation matrix, and generate error detection code bits by modifying a portion of at least one generation matrix of the first and second CRC engines. Therefore, each of the error detection code generation circuits 140 and 460 has various error detection capabilities while reducing hardware overhead.

Figure 20:
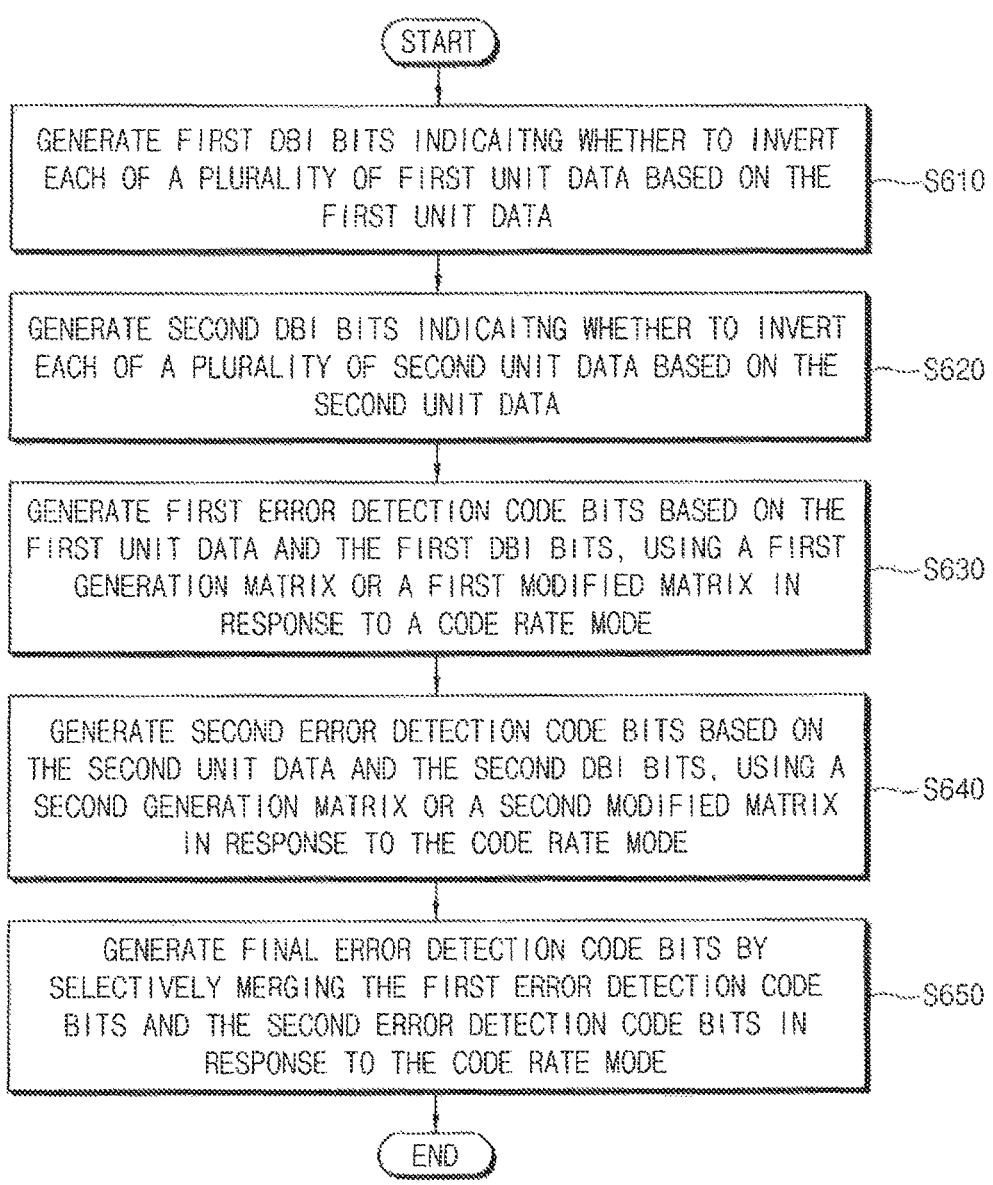
FIG. 20 is a flow chart illustrating a method of generating error detection code bits in a semiconductor device according to exemplary embodiments of the present inventive concept.

FIG. 20 is a flow chart illustrating a method of generating error detection code bits in a semiconductor device according to exemplary embodiments of the present inventive concept.

Referring to FIGS. 2 through 20, in a method of generating error detection code bits in a semiconductor device, first DBI bits UDBI are generated based on a plurality of first unit data UDTA (S610). Each of the first DBI bits UDBI indicates whether each of the first unit data UDTA is inverted. Second DBI bits LDBI are generated based on a plurality of second unit data LDTA (S620). Each of the second DBI bits LDBI indicates whether each of the second unit data LDTA is inverted. First error detection code bits UCRCd are generated based on the first unit data UDTA and the first DBI bits UDBI by using a first generation matrix or a first modified matrix in response to a code rate mode (S630). The first modified matrix may be generated by modifying the first generation matrix. Second error detection code bits LCRCd are generated based on the second unit data LDTA and the second DBI bits LDBI by using a second generation matrix or a second modified matrix in response to the code rate mode (S640). The second modified matrix may be generated by modifying the second generation matrix.

Final error detection code bits are generated by selectively merging the first error detection code bits UCRCd and the second error detection code bits LCRCd in response to the code rate mode (S650). Therefore, the method has various error detection capabilities which can reduce hardware overhead by using a first generation matrix and a second generation matrix which are same, and further, by generating error detection code bits by modifying a portion of at least one generation matrix of the first and second CRC engines.

Figure 21:
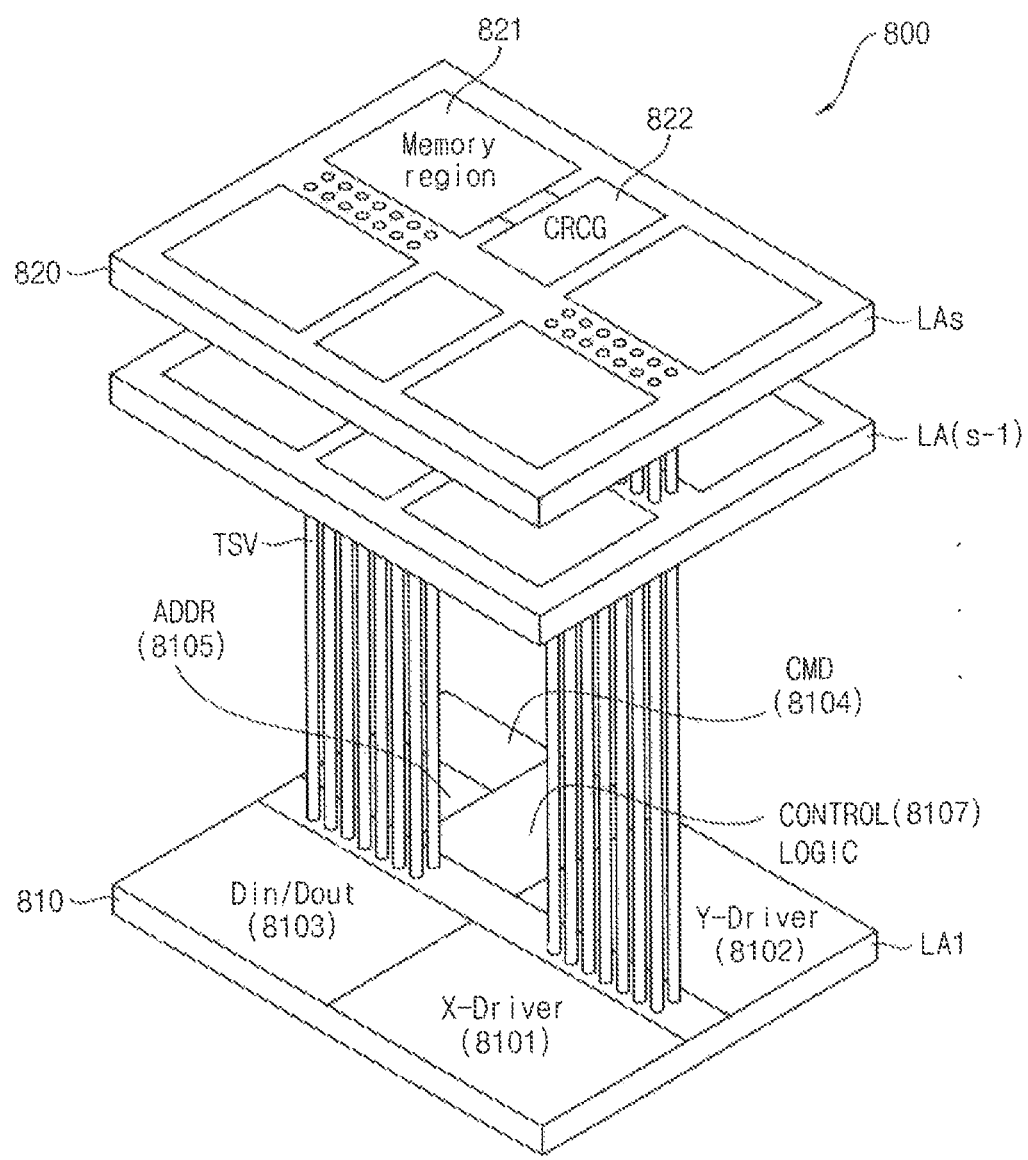
FIG. 21 is a structural diagram illustrating a semiconductor memory device according to exemplary embodiments of the present inventive concept.

FIG. 21 is a structural diagram illustrating a semiconductor memory device according to exemplary embodiments of the present inventive concept.

Referring to FIG. 21, a semiconductor memory device 800 includes first through s-th semiconductor integrated circuit layers LA1 through LAs (s is a natural number greater than two), in which the lowest first semiconductor integrated circuit layer LA1 is an interface or a control chip and the other semiconductor integrated circuit layers LA2 through LAs are slave chips including core memory chips. The first through s-th semiconductor integrated circuit layers LA1 through LAs may transmit and receive signals therebetween through through-silicon-vias (TSVs). The lowest first semiconductor integrated circuit layer LA1 as the interface or control chip may communicate with an external memory controller through a conductive structure formed on an external surface. A description will be made regarding a structure and an operation of the semiconductor memory device 800 by mainly using the first semiconductor integrated circuit layer LA1 or 810 as the interface or control chip and the s-th semiconductor integrated circuit layer LAs or 820 as the slave chip.

The first semiconductor integrated circuit layer 810 includes various peripheral circuits for driving a memory region 821 provided in the s-th semiconductor integrated circuit layer 820. For example, the first semiconductor integrated circuit layer 810 includes a row (X)-driver 8101 for driving word-lines of a memory, a column (Y)-driver 8102 for driving bit-lines of the memory, a data input/output unit (Din/Dout) 8103 for controlling input/output of data, a command buffer (CMD) 8104 for receiving a command CMD from outside and buffering the command CMD, and an address buffer (ADDR) 8105 for receiving an address and buffering the address.

The first semiconductor integrated circuit layer 810 may further include a control logic circuit 8107. The control logic circuit 8107 may access the memory region 821 and may generate control signals for accessing the memory region 821 based on the command from the memory controller.

The s-th semiconductor integrated circuit layer 820 may include the memory region 821, an error detection code generation circuit 822 to detect errors in data to be stored in the memory region 821, and a peripheral region in which peripheral circuits such as a row decoder, a column decoder, and a bit-line sense amplifier are disposed for writing/reading data in the memory region 821.

As described with reference to FIGS. 2 through 20, the error detection code generation circuit 822 may have various error detection capabilities which reduce hardware overhead by using a first generation matrix and a second generation matrix which are same and by generating error detection code bits by modifying a portion of at least one generation matrix of the first and second CRC engines.

In addition, in exemplary embodiments of the present inventive concept, a three dimensional (3D) memory array is provided in semiconductor memory device 800. The 3D memory array is monolithically formed in one or more physical levels of arrays of memory cells having an active area disposed above a silicon substrate and circuitry associated with the operation of those memory cells. The associated circuitry may be above or within the substrate. The term "monolithic" may mean that layers of each level of the array are directly deposited on the layers of each respective underlying level of the array. The following patent documents describe configurations for the 3D memory arrays, in which a 3D memory array is configured as a plurality of levels, with word-lines and/or bit-lines shared between levels: U.S. Pat. Nos. 7,679,133; 8,553,466; 8,654,587; 8,559,235; and U.S. Pat. Application Pub. No. 2011/0233648.

Figure 22:
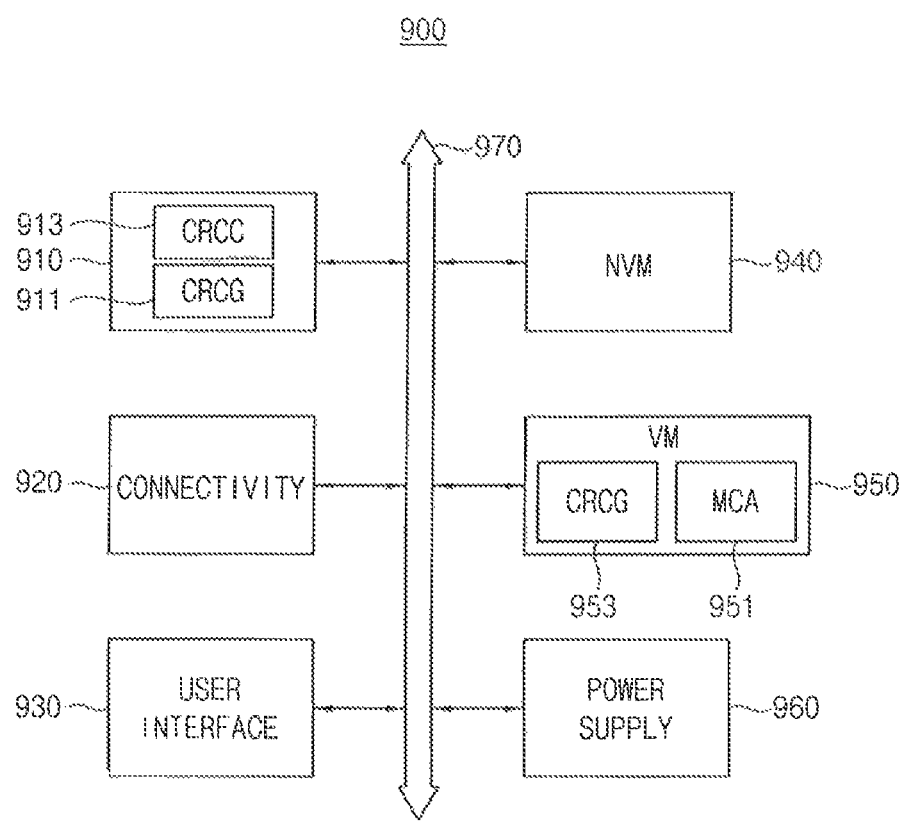
FIG. 22 is a block diagram illustrating a mobile system including the semiconductor memory device according to exemplary embodiments of the present inventive concept.

FIG. 22 is a block diagram illustrating a mobile system including the semiconductor memory device according to exemplary embodiments of the present inventive concept.

Referring to FIG. 22, a mobile system 900 may include an application processor 910, a connectivity unit 920, a volatile memory device 950, a nonvolatile memory device 940, a user interface 930 and a power supply 960 connected via a bus 970.

The application processor 910 may execute applications, such as a web browser, a game application, a video player, etc. The application processor 910 includes an error detection code generation circuit 911 and an error detector 913. The connectivity unit 920 may perform wired or wireless communication with an external device. The volatile memory device 950 may store data processed by the application processor 910 or operate as a working memory. The volatile memory device 950 may employ the semiconductor memory device 200a of FIG. 14. The volatile memory device 950 includes a memory cell array 951 and an error detection code generation circuit 953.

The nonvolatile memory device 940 may store a boot image for booting the mobile system 900. The user interface 930 may include at least one input device, such as a keypad, a touch screen, etc., and at least one output device, such as a speaker, a display device, etc. The power supply 960 may supply a power supply voltage to the mobile system 900.

In exemplary embodiments of the present inventive concept, the mobile system 900 and/or components of the mobile system 900 may be packaged in various forms.

Exemplary embodiments of the present inventive concept may be applied to semiconductor devices and systems using the error detection code generation circuit. For example, exemplary embodiments of the present inventive concept may be applied to systems such as a mobile phone, a smart phone, a personal digital assistant (PDA), a portable multimedia player (PMP), a digital camera, a camcorder, a personal computer (PC), a server computer, a workstation, a laptop computer, a digital television, a set-top box, a portable game console, a navigation system, or other such electronic devices.

While the present inventive concept has been particularly shown and described with reference to exemplary embodiments thereof, it will be apparent to those of ordinary skill in the art that various changes in form and detail may be made therein without departing from the spirit and scope of the present inventive concept as defined by the following claims.

What is claimed is:

1. An error detection code generation circuit of a semiconductor device, the error detection code generation circuit comprising:
    a first cyclic redundancy check (CRC) engine configured to generate first error detection code bits using a first generation matrix, based on a plurality of first unit data and first data bus inversion (DBI) bits, wherein each of the first DBI bits indicates whether a corresponding bit of the first unit data is inverted;
    a second CRC engine configured to generate second error detection code bits using a second generation matrix, based on a plurality second unit data and second DBI bits, wherein each of the second DBI bits indicates whether a corresponding bit of the second unit data is inverted;
    a multiplexer configured to select one of a most significant bit of the second error detection code bits and an inverted version of the most significant bit of the second error detection code bits in response to a mode signal indicating a code rate mode; and
    an output selection engine configured to generate final error detection code bits by merging the first error detection code bits, and the second error detection code bits and the selected one of the second error detection code bits in response to the mode signal,
    wherein the first generation matrix is the same as the second generation matrix.

2. The error detection code generation circuit of claim 1, wherein when the mode signal designates a first code rate mode,
    the first CRC engine is configured to generate the first error detection code bits by using the first generation matrix,
    the second CRC engine is configured to generate the second error detection code bits by using the second generation matrix, and
    the output selection engine is configured to provide the first error detection code bits as upper bits of the final error detection code bits and to provide the second error detection code bits as lower bits of the final error detection code bits.

3. The error detection code generation circuit of claim 1, wherein when the mode signal designates a second code rate mode,
    the output selection engine is configured to output the final error detection code bits by merging corresponding bits of the first error detection code bits and the second error detection code bits, and
    the second code rate mode includes a first sub code rate mode, and a second sub code rate mode.

4. The error detection code generation circuit of claim 3, wherein when the mode signal designates the first sub code rate mode,
    the first CRC engine is configured to generate the first error detection code bits by using the first generation matrix,
    the second CRC engine is configured to generate the second error detection code bits by using a second modified matrix, and
    the second modified matrix is generated by inverting matrix elements of rows of the second generation matrix, wherein the inverted matrix elements are associated with the most significant bit of the second error detection code bits.

5. The error detection code generation circuit of claim 3, wherein when the mode signal designates the second sub code rate mode,
    the first CRC engine is configured to generate the first error detection code bits by using the first generation matrix,
    the second CRC engine is configured to generate the second error detection code bits by using a second modified matrix, and
    the second modified matrix is generated by inverting all or some of matrix elements of a portion of rows of the second generation matrix.

6. The error detection code generation circuit of claim 3, wherein when the mode signal designates the second sub code rate mode,
    the first CRC engine is configured to generate the first error detection code bits by using a first modified matrix,
    the second CRC engine is configured to generate the second error detection code bits by using a second modified matrix,
    the first modified matrix is generated by inverting matrix elements of rows of the first generation matrix, wherein the inverted matrix elements of the first generation matrix are associated with a most significant bit of the first error detection code bits, and
    the second modified matrix is generated by inverting matrix elements of rows of the second generation matrix, wherein the inverted matrix elements of the second generation matrix are associated with the most significant bit of the second error detection code bits.

7. A memory controller, comprising:
    an error detection code generation circuit configured to generate first error detection code bits based on a plurality of first unit data and first data bus inversion (DBI) bits, wherein each of the first DBI bits indicates whether a corresponding bit of the first unit data is inverted, to generate second error detection code bits based on a plurality second unit data and second DBI bits, wherein each of the second DBI bits indicates whether a corresponding bit of the second unit data is inverted, to select one of a most significant bit of the second error detection code bits and an inverted version of the most significant bit of the second error detection code bits in response to a mode signal, to output the selected error detection code bit and to generate final error detection code bits by merging the first error detection code bits, the second error detection code bits and the selected error detection code bit, wherein the mode signal indicates a code rate mode and the first unit data and the second unit data are included in a main data; and an error detector configured to detect errors of the main data which is to be transmitted to a semiconductor memory device, based on return final error detection code bits and the final error detection code bits, wherein the semiconductor memory device is configured to receive the main data, the first DBI bits and the second DBI bits to generate the return final error detection code bits, wherein the error detection code generation circuit is configured to generate the first error detection code bits and the second error detection code bits by using a same generation matrix.

8. The memory controller of claim 7, wherein the error detector comprises:

a first buffer to store the final error detection code bits;
a second buffer to store the return final error detection code bits;
a comparator connected to the first buffer and the second buffer, the comparator configured to compare corresponding bits of the final error detection code bits and the return final error detection code bits and to generate syndrome data which indicates a match between the corresponding bits of the final error detection code bits and the return final error detection code bits; and
a detector configured to generate a detection signal which indicates whether the main data includes the errors, in response to the syndrome data.

9. The memory controller of claim 7, wherein the error detection code generation circuit comprises:

a first cyclic redundancy check (CRC) engine configured to generate the first error detection code bits using a first generation matrix, based on the first unit data and the first DBI bits in response to the mode signal;
a second CRC engine configured to generate the second error detection code bits using a second generation matrix, based on the second unit data and second DBI bits, in response to the mode signal; and
an output selection engine configured to generate the final error detection code bits by merging the first error detection code bits and the second error detection code bits in response to the mode signal, wherein the first generation matrix is the same as the second generation matrix.

10. The memory controller of claim 9, wherein a number of the final error detection code bits varies in response to the code rate mode designated by the mode signal, when the mode signal designates a first code rate mode,
the first CRC engine is configured to generate the first error detection code bits by using the first generation matrix,
the second CRC engine is configured to generate the second error detection code bits by using the second generation matrix, and
the output selection engine is configured to provide the first error detection code bits as upper bits of the final error detection code bits and to provide the second error detection code bits as lower bits of the final error detection code bits.

11. The memory controller of claim 9, wherein a number of the final error detection code bits varies in response to the code rate mode designated by the mode signal, when the mode signal designates a second code rate mode,
the output selection engine is configured to output the final error detection code bits by merging corresponding bits of the first error detection code bits and the second error detection code bits, and
the second code rate mode includes a first sub code rate mode, and a second sub code rate mode.

12. The memory controller of claim 11, wherein an error detection capability of the error detection code generation circuit in the second sub code rate mode is greater than an error detection capability of the error detection code generation circuit in the first sub code rate mode.

13. The memory controller of claim 7, wherein when the error detection code generation circuit operates in a second code rate mode in response to the mode signal, an error detection capability of the error detection code generation circuit which uses at least one of a first modified matrix and a second modified matrix is greater than an error detection capability of the error detection code generation circuit which uses the first generation matrix and the second generation matrix, wherein the first modified matrix is generated by modifying the first generation matrix and the second modified matrix is generated by modifying the second generation matrix.

14. An error detection code generation circuit for a semiconductor memory device, the error detection code generation circuit comprising:

a first cyclic redundancy check (CRC) engine configured to receive first unit data and to generate first error detection code bits based on the first unit data;
a second CRC engine configured to receive second unit data and to generate second error detection code bits based on the second unit data;
a multiplexer configured to select one of a most significant bit of the second error detection code bits and an inverted version of the most significant bit of the second error detection code bits in response to a mode signal; and
an XOR circuit configured to receive the first error detection code bits and the second error detection code bits, and to merge the first error detection code bits, the second error detection code bits and the selected one of the second error detection code bits into final error detection code bits by performing an exclusive OR function,
wherein the first error detection code bits and the second error detection code bits are output in a full rate mode in response to a first level of the mode signal and the final detection code bits are output in a half rate mode in response to a second level of the mode signal.

15. The error detection code generation circuit of claim 14, wherein the first CRC engine further receives first data bus inversion bits along with the first unit data, and the second CRC engine further receives second data bus inversion bits along with the second unit data.

16. The error detection code generation circuit of claim 15, wherein the first CRC engine uses a first generation matrix for generating the first error detection code bits based on the first unit data and the first data bus inversion bits, and the second CRC engine uses a second generation matrix for generating the second error detection code bits based on the second unit data and the second data bus inversion bits.

17. The error detection code generation circuit of claim 16, wherein the first generation matrix and the second generation matrix are the same when the full rate mode is selected and the first generation matrix and the second generation matrix are different from each other when the half rate mode is selected.

18. The error detection code generation circuit of claim 17, wherein, during the half rate mode, one bit of the second generation matrix is inverted while a corresponding bit of the first generation matrix is not inverted.

19. The error detection code generation circuit of claim 17, wherein the full rate mode indicates normal data output speed, and the half rate mode indicates half of the normal data output speed.

20. The error detection code generation circuit of claim 14, wherein the first unit data and the second unit data are sixty four bits respectively, the first data bus inversion bits and the second data bus inversion bits are eight bits respectively, and the first error detection code bits and second error detection code bits are eight bits respectively, and the final error detection code bits are eight bits.

* * * * *

UNITED STATES PATENT AND TRADEMARK OFFICE
CERTIFICATE OF CORRECTION

PATENT NO. : 10,476,529 B2
APPLICATION NO. : 15/789653
DATED : November 12, 2019
INVENTOR(S) : Cha et al.

Page 1 of 1

It is certified that error appears in the above-identified patent and that said Letters Patent is hereby corrected as shown below:

In the Claims

Column 20, Line 57, Claim 14, "final detection code--" should read "final error detection code--".

Signed and Sealed this
Fifth Day of May, 2020

Andrei Iancu
*Director of the United States Patent and Trademark Office*